United States Patent
Hirosaki et al.

(10) Patent No.: US 7,825,580 B2
(45) Date of Patent: Nov. 2, 2010

(54) FLUOROPHOR AND METHOD FOR PRODUCTION THEREOF AND ILLUMINATOR

(75) Inventors: Naoto Hirosaki, Ibaraki (JP); Rong-Jun Xie, Ibaraki (JP); Mamoru Mitomo, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 253 days.

(21) Appl. No.: 11/994,383

(22) PCT Filed: Jun. 28, 2006

(86) PCT No.: PCT/JP2006/312922

§ 371 (c)(1),
(2), (4) Date: Jan. 8, 2008

(87) PCT Pub. No.: WO2007/004492

PCT Pub. Date: Jan. 11, 2007

(65) Prior Publication Data

US 2009/0085465 A1    Apr. 2, 2009

(30) Foreign Application Priority Data

Jul. 1, 2005    (JP)    ............................. 2005-193315

(51) Int. Cl.
*H01J 1/63*    (2006.01)
*C09K 11/66*    (2006.01)

(52) U.S. Cl. ............................. 313/503; 252/301.4 F; 313/486

(58) Field of Classification Search ........... 252/301.4 F; 313/486, 503

See application file for complete search history.

(56) References Cited

U.S. PATENT DOCUMENTS

| 6,066,861 | A | 5/2000 | Hohn et al. |
| 6,657,379 | B2 * | 12/2003 | Ellens et al. ................. 313/503 |
| 7,391,060 | B2 * | 6/2008 | Oshio .......................... 257/98 |
| 2004/0155225 | A1 | 8/2004 | Yamada et al. |
| 2005/0012075 | A1 | 1/2005 | Sakata et al. |
| 2007/0257231 | A1 * | 11/2007 | Hirosaki ............... 252/301.4 F |
| 2008/0309220 | A1 * | 12/2008 | Sakata et al. ................. 313/503 |

(Continued)

FOREIGN PATENT DOCUMENTS

JP    H10-093146 A    4/1998

(Continued)

OTHER PUBLICATIONS

Mukai, Nakamura, "White and UV LEDs," Oyo Buturi, vol. 68, 152-55 (1998).

(Continued)

*Primary Examiner*—Karabi Guharay
*Assistant Examiner*—Sheryl Hull
(74) *Attorney, Agent, or Firm*—Alfred A. Stadnicki

(57) ABSTRACT

A fluorophor comprising, as a main component, an α-type sialon crystal which contains at least an A element (wherein A represents one or more elements selected from among Mn, Ce, Pr, Nd, Sm, Eu, Tb, Dy, Er, Tm and Yb), an M element (wherein M represents one or more elements selected from among Li, Na, Mg, Ca, Y, La, Gd and Lu), Si, Al, oxygen and nitrogen, and is represented by the general formula: $(M_x, A_y)(Si_{12-(m+n)}Al_{m+n})(O_nN_{16-n})$ (1)  $m=\delta_M xx+\delta_A xy$ (2)  $0.2 \leq x \leq 2.4$ (3) $0.001 \leq y \leq 0.4$ (4) and $0.5 \times m < n \leq 4$ (5). The fluorophor is reduced in the lowering of brightness, and is useful for a white color LED and the like.

20 Claims, 5 Drawing Sheets

U.S. PATENT DOCUMENTS

2009/0021141 A1* 1/2009 Emoto et al. ............ 313/503

FOREIGN PATENT DOCUMENTS

| JP | H10-242513 A | 9/1998 |
|---|---|---|
| JP | H11-500584 A | 1/1999 |
| JP | 2002-363554 A | 12/2002 |
| JP | 2003-336059 A | 11/2003 |
| JP | 2004-067837 A | 3/2004 |
| JP | 2004-186278 A | 7/2004 |
| JP | 2004-238505 A | 8/2004 |
| JP | 2004-238506 A | 8/2004 |
| JP | 2005-36038 A | 2/2005 |

OTHER PUBLICATIONS

J. W. H. van Krevel, "On new rare-earth doped M—Si—Al—O—N materials luminescence properties and oxidation resistance", Thesis, ISBN 90-386-2711-4, Eindhoven Technische Univ.

J. W. H. van Krevel et al. "Long wavelength $Ca^{3+}$ emission in Y—Si—O—N materials", J. Alloys and Compounds, 268,272-277(1998)).

J. W. H. van Krevel et al, "Luminescence properties of terbium-, cerium-, or europium-doped a-sialon materials", J. Solid State Chem. 165, 19-24 (2002).

R. J. Xie et al, "Preparation and Luminescence spectra of calcium- and rare-earth (R=Eu, Tb and Pr) codoped a-SiAlON ceramics", J. Am. Ceram. Soc. 85, 1229-1234 (2002).

\* cited by examiner

[Fig. 1]
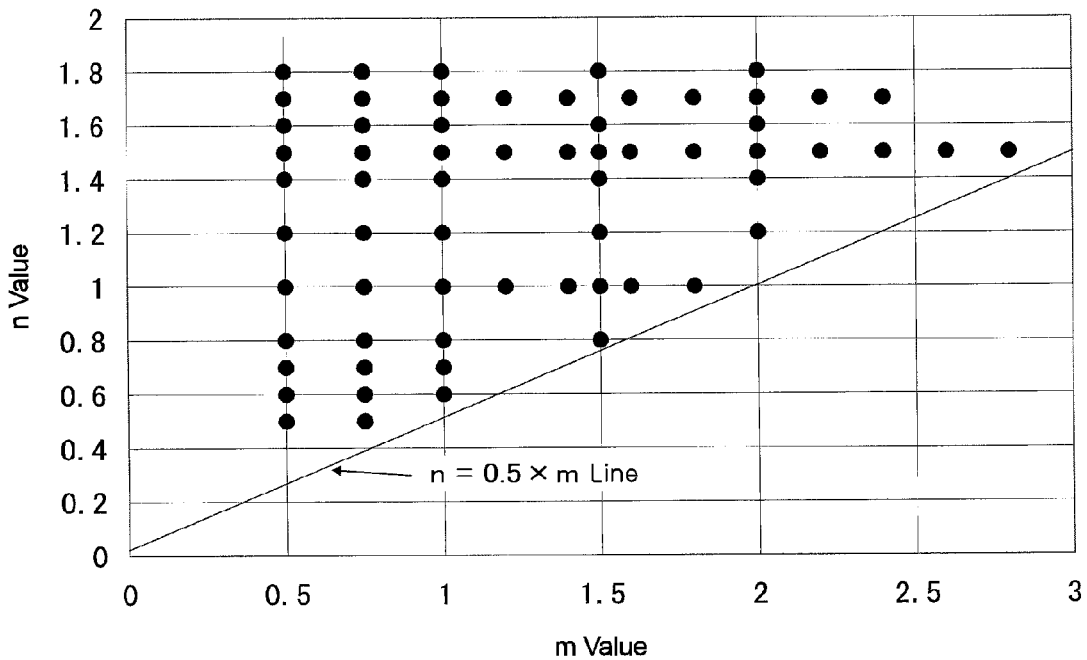
[Fig. 2]
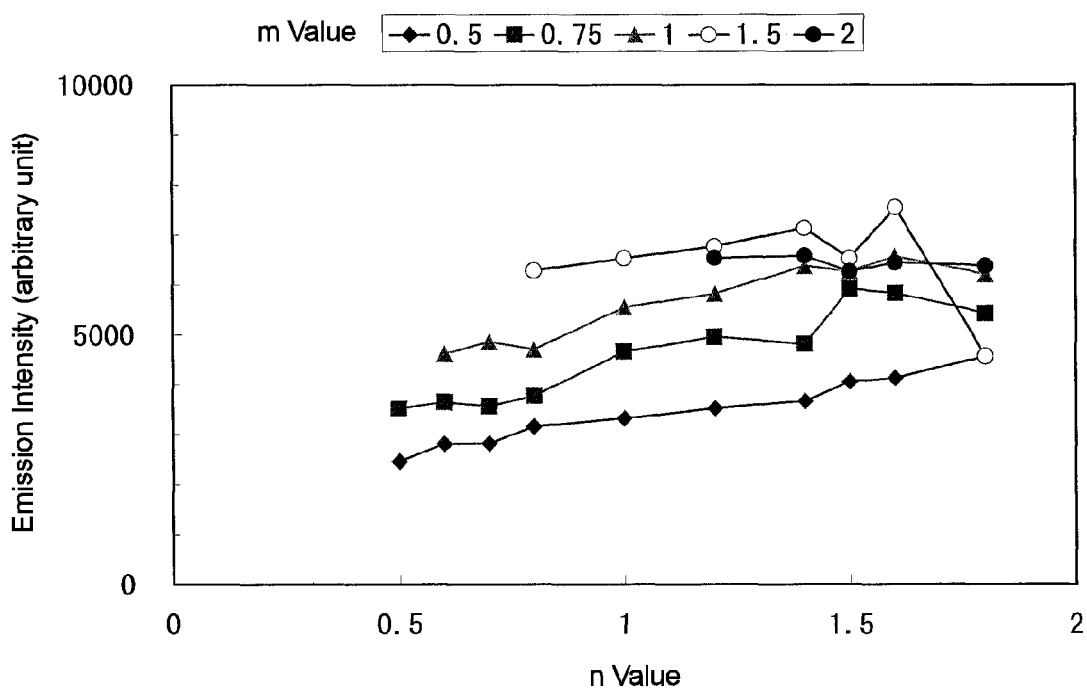

[Fig. 3]
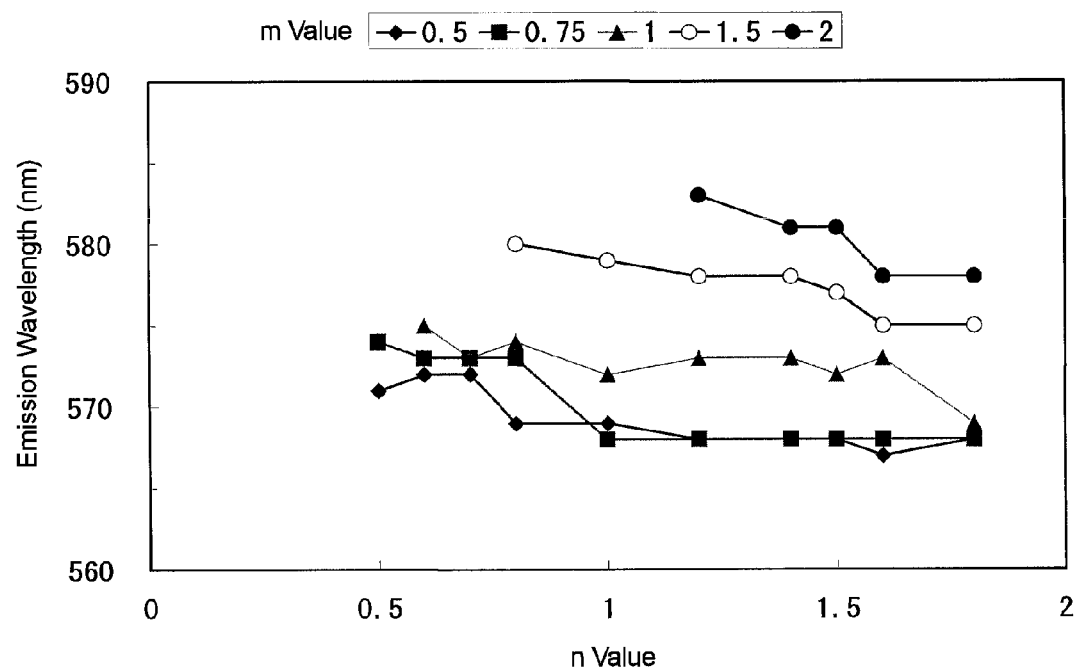
[Fig. 4]
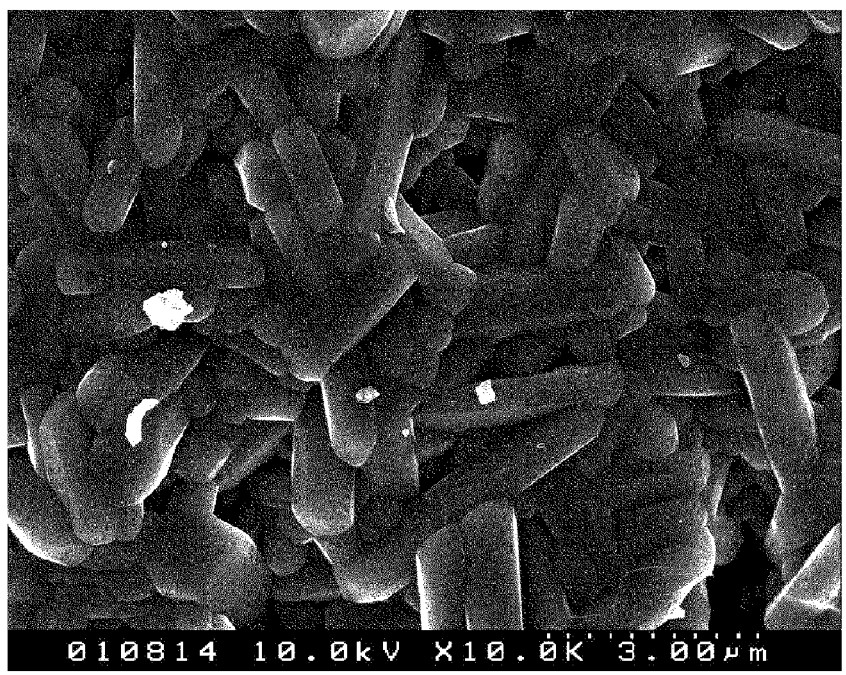

[Fig. 5]
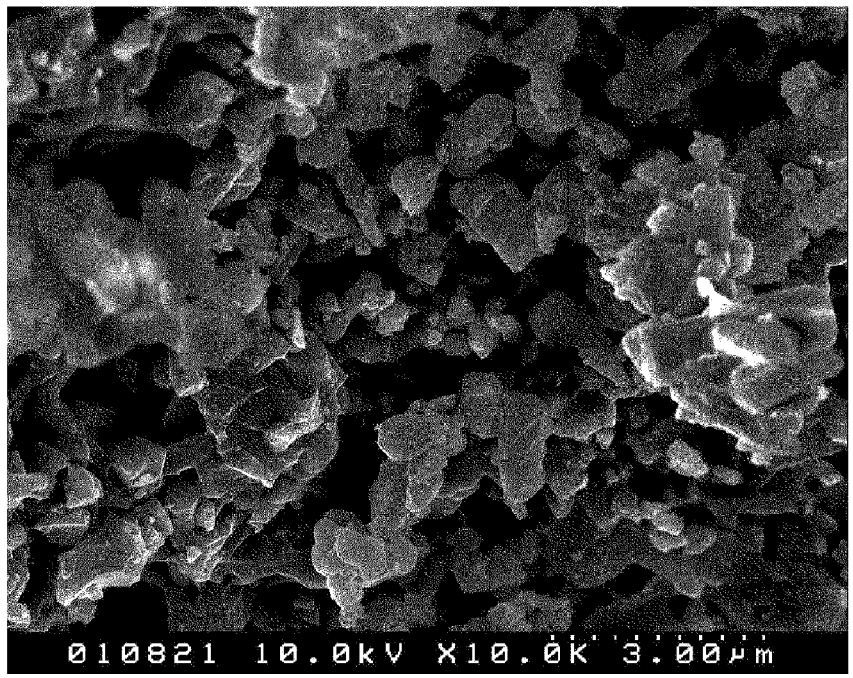
[Fig. 6]
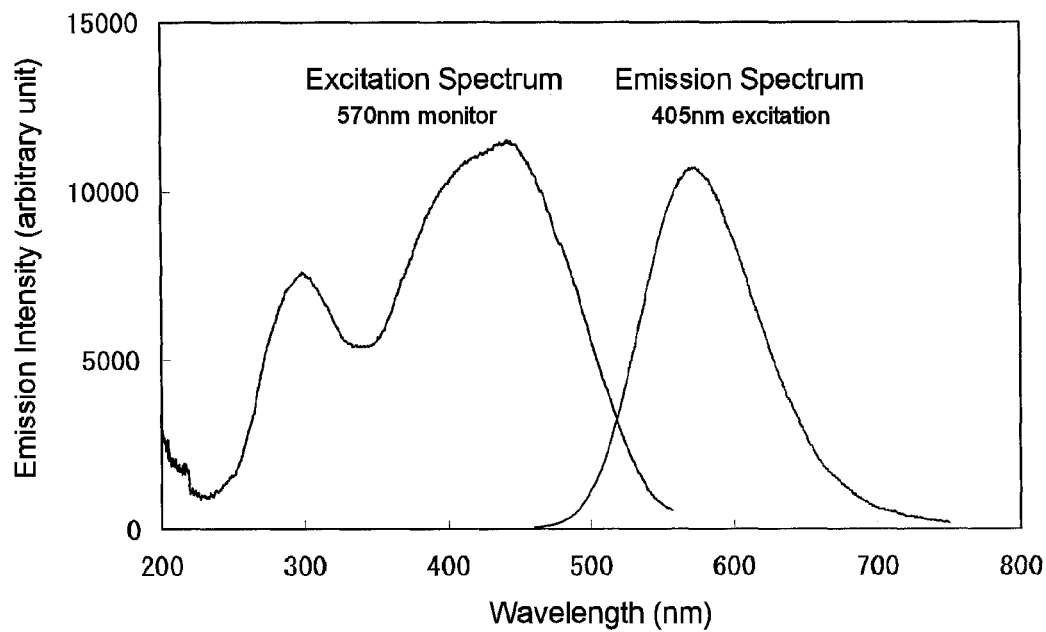

[Fig. 7]
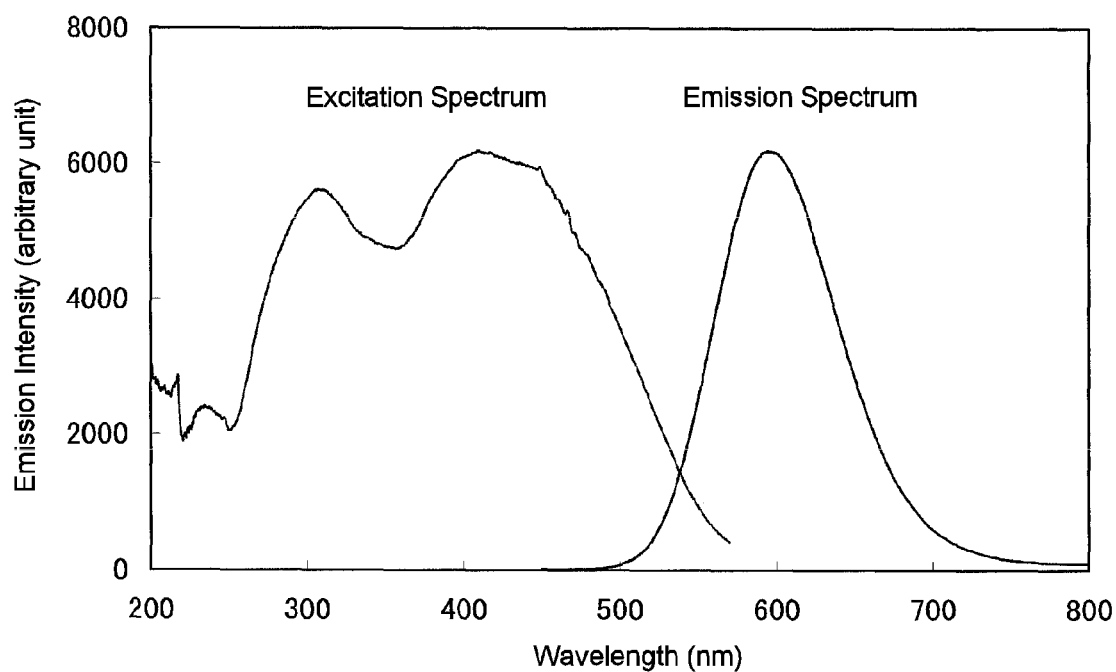
[Fig. 8]
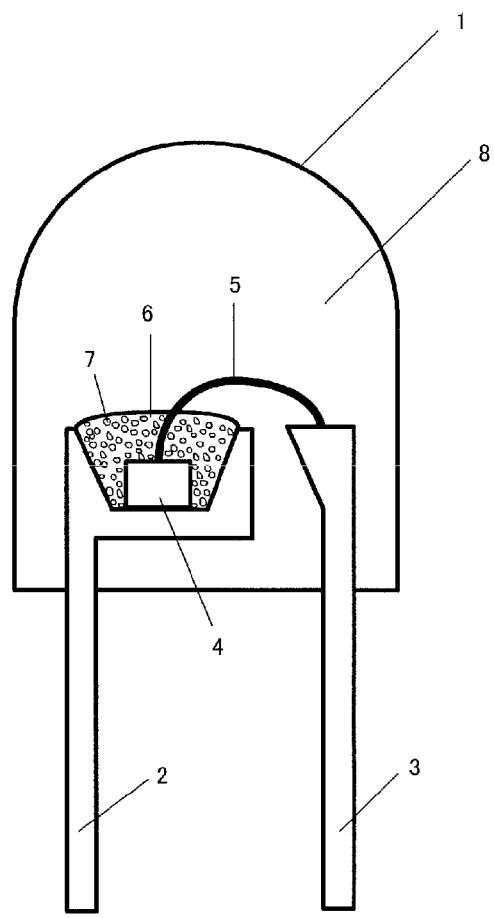

[Fig. 9]
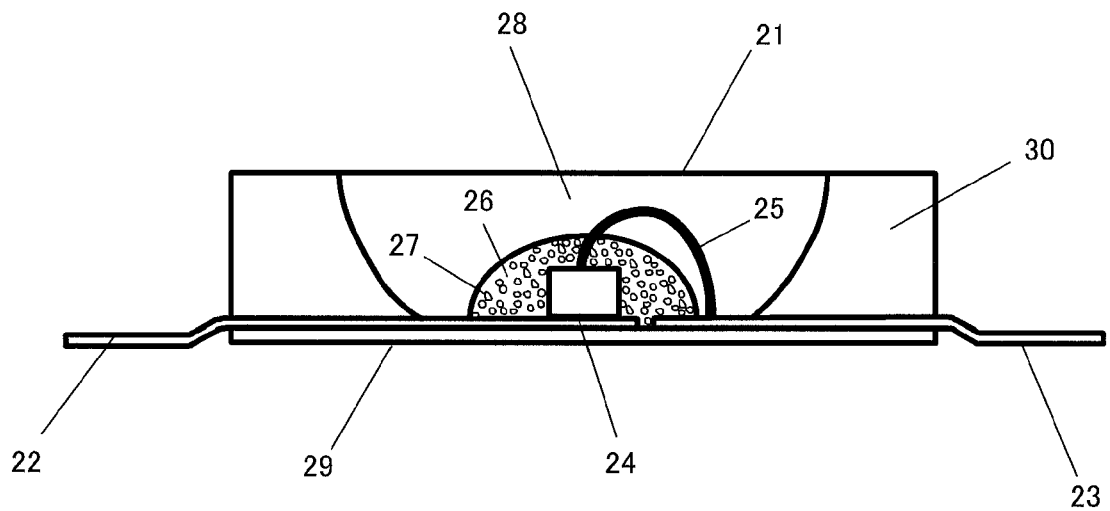
[Fig. 10]
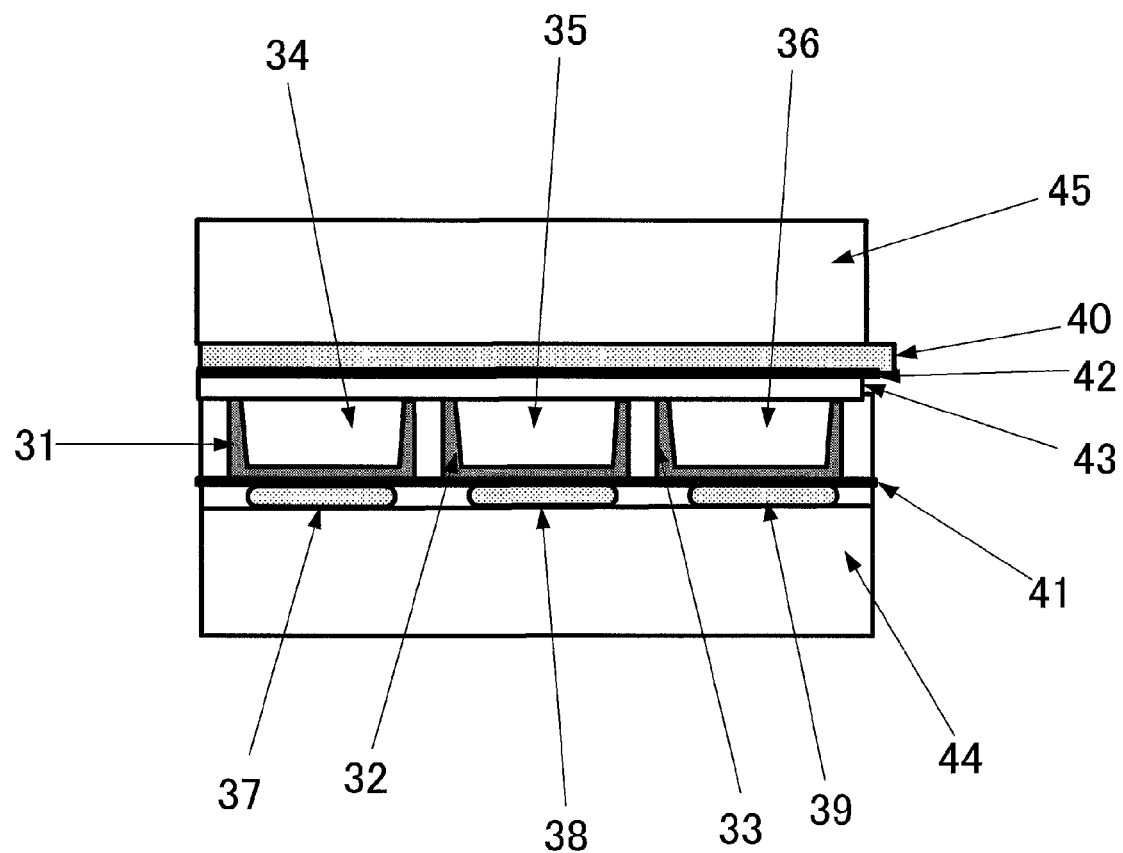

FLUOROPHOR AND METHOD FOR PRODUCTION THEREOF AND ILLUMINATOR

TECHNICAL FIELD

The present invention relates to a phosphor comprising an inorganic compound as a main component and a manufacture thereof and an application thereof. More specifically, the application relates to a lighting apparatus and an emission apparatus of an image display device utilizing features of the phosphor, that is, properties to emit fluorescence of rather long wavelength from 530 nm to 585 nm.

BACKGROUND ART

A phosphor is utilized in a fluorescent display tube (VFD), a field emission display (EFD), a plasma display panel (PDP), a cathode-ray tube (CRT), a white color emission diode, and so on. In any of these applications, it is necessary to provide the phosphor with energy to excite the phosphor in order to render the emission and the phosphor is excited by the excitation source with high energy such as a vacuum ultraviolet ray, an ultraviolet ray, an electron beam, a blue light, and the like so as to emit a visible light. However, the phosphor deteriorates as a result of exposure to the above-mentioned excitation source such that there is an issue that the brightness of the phosphor decreases as it is used for a long period of time and the phosphor in which the brightness does not deteriorate is desired.

A white color LED has been used in a field of disaster light, beacon, and the like where reliability is required, a field of in-vehicle light, a back light of a mobile phone, and the like where reduction in size and weight is strongly desired, a field of direction board where visibility is required. The emission color of this white color LED, i.e., the white light may be obtained by mixing lights such that the white light is a mixture of a yellow light emitted by a phosphor and a blue light emitted by a blue color LED of wavelength from 430 to 480 nm as the emission source. The phosphor suitable for such white color LED is, by a small amount, arranged on the surface of the blue color LED chip as the emission source. Therefore, the phosphor which emits a yellow light upon irradiation of the blue color LED is desired for this application. Further, in view of reducing fluctuation of emission color caused by the temperature change of the application environment where the device is used, phosphor material emitting fluorescence with a small fluctuation in the emission intensity caused by the temperature change is also desired.

As the emission material to emit a yellow light upon irradiation of the blue color LED, garnet $((Y, Gd)_3(Al, Ga)_5O_{12}$: Ce. Hereinafter, referred to as "YAG:Ce"), which is an oxide, is known. This phosphor was formed by replacing Y sites partially with Gd and Al sites partially with Ga, and doping $Ce^{3+}$ as the optically-activating ion at the same time (Non-patent reference 1). Although this phosphor is known as a highly efficient phosphor, the emission intensity is lowered as the temperature increases such that there is an issue that the emission color of the device varies depending on the temperature when it is used in the white color LED.

A phosphor comprising α-type sialon as a host crystal is proposed as a yellow color phosphor with a small temperature fluctuation of emission. The α-type sialon is a crystal to form an interstitial solid solution wherein Li, Ca, Mg, Y, or a lanthanide metal solid solves interstitially into the α-type $Si_3N_4$ crystal. The α-type $Si_3N_4$ crystal structure has two large spaces having diameters of about 0.1 nm interstitially in the unit cell. The structure is stabilized if metal atoms solid solve in such spaces. Therefore, the general formula of α-type sialon containing a metal element M is given by:

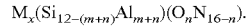

Here, x is the number of M atoms contained in the α-type $Si_3N_4$ unit cell. Further, m corresponds to the number of Al—N bonds substituting Si—N bonds in the α-type $Si_3N_4$ crystal structure and m=δ x (here, δ is the valence number of metal M). Here, n is the number of Al—O bonds substituting Si—N bonds. The electric neutrality is maintained by the above lattice substitution and interstitial solid solution. In the α-sialon, metal-nitrogen bonds are main bonds such that the α-sialon is a solid solution with a high percentage of nitrogen content.

It is publicly know before this patent application that α-type sialon becomes a phosphor if some of stabilizing metal atoms solid solving interstitially into the α-type sialon are substituted with optically activating metal ions (Non-patent references 2 to 4). Further, it is also publicly known that a phosphor material having Ca-α-sialon as a host crystal and being doped with $Eu^{2+}$ becomes material to render a yellow color emission upon irradiation of a visible light of the violet-blue wavelength region (Patent references 1 and 2).

It is disclosed that this material emits a yellow light which is a complementary color of a blue color upon irradiation of the excitation light of the blue color LED, and that this material can be used as a phosphor for the white color LED by mixing lights of both colors (Patent reference 3). However, in these materials, there still is an issue that the emission intensity is not high enough because the amount of $Eu^{2+}$ solid solving into the α-type sialon lattice is small. Further, it was reported that Ca-α-sialon doped with $Eu^{2+}$ became a phosphor to emit a yellow light of 550 to 600 nm upon excitation by the blue light of 450 to 500 nm. However, in the composition having the best emission efficiency, the emission wavelength is from 585 to 600 nm such that a white color LED having the excitation source of the blue color LED emitting a light of 450 to 470 nm emits a white light with mixed colors which is a lamp color to have the correlated color temperature of 3000 K. Therefore, it was difficult to obtain the light emission of a daylight color, a day white color, and a white color of the correlated color temperature of 5000 K to 6500 K, which is usually used for an ordinary light.

The researches for adjusting solid solution metal and solid solution amount in the α-type sialon contained in the phosphor as the host crystal are conducted (Patent reference 4). Among such researches, it was reported that the emission peak wavelength varied in the range of 580 nm to 604 nm based on the composition control. However, there was an issue that the emission intensity was lowered when the peak wavelength was made less than 585 nm such that it was difficult to apply such phosphor to the practical use. That is, in the α-type sialon with an Eu luminescence center, a yellow-green color phosphor rendering the emission of shorter wavelength was desired.

In the conventional technology of the lighting apparatus, a white color emission diode of a combination of a blue color light-emitting diode device and a yellow color emitting phosphor to be excited by the blue color light is publicly known and is implemented in various kinds of lighting applications. As typical examples thereof, Japanese patent No. 2900928, "Light-emitting diode" (Patent reference 5); Japanese patent No. 2927279, "Light-emitting diode"(Patent reference 6); Japanese patent No. 3364229, "Wavelength conversion material and its manufacture and light-emitting device" (Patent reference 7); and so on are cited. In these light-emitting diodes, phosphors being used particularly often are phosphors in the Ce-activated yttrium-aluminum-garnet (YAG:Ce) system and expressed by the general formula:

$(Y, Gd)_3(Al, Ga)_5O_{12}:Ce^{3+}$.

However, the white color emission diode comprising: a blue color light-emitting diode device and a phosphor in the YAG:Ce system has the emission intensity which is lowered when the temperature increases such that there was an issue that the emission color fluctuated because of deteriorated balance between the blue and yellow lights when the devices were warmed up as the time goes by after turning on the switch.

In these backgrounds, a phosphor which emits a yellow-green color light of shorter wavelength than that of Ca-α-sialon doped with $Eu^{2+}$ and shows the brightness of smaller temperature fluctuation than the phosphor in the YAG:Ce system was desired.

[Patent reference 1] Japanese patent application publication No. 2002-363554

[Patent reference 2] Japanese patent application publication No. 2003-336059

[Patent reference 3] Japanese patent application publication No. 2004-186278

[Patent reference 4] Japanese patent application publication No. 2004-67837

[Patent reference 5] Japanese patent No. 2900928

[Patent reference 6] Japanese patent No. 2927279

[Patent reference 7] Japanese patent No. 3364229

[Non-patent reference 1] Mukai, Nakamura, "White and UV LEDs," Oyo Buturi, Vol. 68, 152-55 (1998).

[Non-patent reference 2] J. W. H. van Krevel, "On new rare-earth doped M-Si—Al—O—N materials luminescence properties and oxidation resistance," Thesis, ISBN 90-386-2711-4, Eindhoven Technische Universiteit Eindhoven (2000).

[Non-patent reference 3] J. W. H. van Krevel et al. "Long wavelength $Ca^{3+}$ emission in Y—Si—O—N materials", J. Alloys and Compounds, 268, 272-277 (1998))

[Non-patent reference 4] J. W. H. van Krevel et al, "Luminescence properties of terbium-, cerium-, or europium-doped α-sialon materials," J. Solid State Chem. 165, 19-24 (2002).

[Non-patent reference 5] R. J. Xie et al, "Preparation and Luminescence spectra of calcium-and rare-earth (R=Eu, Tb and Pr) codoped α-SiAlON ceramics", J. Am. Ceram. Soc. 85, 1229-1234 (2002).

DESCRIPTION OF THE INVENTION

Problems to be Solved by the Invention

The present invention was conceived in response to such desire. And one of the objects is to provide an inorganic phosphor which emits a yellow-green color with a high intensity of shorter wavelength than that of a rare earth activated sialon phosphor such as a conventional Ca-α-sialon, has the emission intensity fluctuated only slightly by the temperature change, and is chemically stable. Another object of the present invention is to provide a lighting apparatus having a small temperature fluctuation and an endurable emission apparatus of an image display device by utilizing such phosphor.

Means for Solving Problems

The present inventors conducted detailed researches about the contents of oxygen and nitrogen in the phosphor having α-type sialon crystal as a host crystal under such situations and found a phosphor having α-type sialon crystal of a specific composition as a host crystal, which is activated by optically activating metal such as Mn, Ce, Pr, Nd, Sm, Eu, Tb, Dy, Er, Tm, or Yb, had the emission intensity with a small fluctuation due to the temperature change and emitted fluorescence with higher intensity than that of the conventionally-reported phosphor having nitride or oxynitride as a host crystal. Further, it was also found that a phosphor with a specific composition containing solid solution of a specific metal emitted a yellow-green color light of shorter wavelength.

That is, it was found that a crystal of a specific composition became a phosphor emitting fluorescence having a high intensity and a small temperature fluctuation as a result of intensive researches about an inorganic compound of α-type sialon as a major component comprising: an M element as a stabilizing element for α-sialon (here, M is one or more kinds of elements selected from Li, Na, Mg, ca, Y, La, Gd, and Lu) and an A element as an emission ion (here, A is one or more kinds of elements selected from Mn, Ce, Pr, Nd, Sm, Eu, Tb, Dy, Er, Tm, and Yb). In particular, the inorganic compound activated by Eu was found to emit the yellow-green light of shorter wavelength than that of the conventionally-reported α-sialon phosphor and to become a phosphor emitting fluorescence of a high intensity.

Further, it was found to be possible to obtain a white color emission diode with a small temperature fluctuation and a high emission efficiency, and an image display device rendering bright coloring by utilizing such phosphor.

The phosphor of the present invention is a new phosphor containing a crystal as a host crystal having a totally different composition than that of sialon such as $Ca_{1.47}Eu_{0.03}Si_9Al_3N_{16}$ or the like as disclosed in Chapter 11 of Non-patent reference 2.

In general, a phosphor of an inorganic compound activated with Mn or a rare earth element as a luminescence center element A renders an emission in which an emission color and an intensity thereof vary according to an electronic state around the A element. For example, it was reported that the phosphor having a luminescence center of divalent Eu emitted a blue color, a green color, a yellow color, and a red color by changing the host crystal. That is, the emission color and the intensity of the emission of the phosphor would be totally different if the constituent element or a liganding environment in the crystal structure taking in "A" or a host crystal structure thereof is changed although the phosphor has a similar composition such that such phosphor would be regarded as a totally different phosphor. In the present invention, the phosphor has a totally different composition as the host than that of any of sialon and nitride or oxynitride having been reported and the phosphor having such composition as the host so far has not been reported. Further, the phosphor having the composition of the present invention as the host emits fluorescence of higher intensity than a phosphor having a conventional crystal as the host. And the phosphor of a specific composition shows a yellow-green color emission.

The present inventors conducted intensive researches in consideration of the above-mentioned background so as to successfully provide a phosphor rendering emission with a high intensity of a specific wavelength region by implementing the configuration recited in any one from (1) to (10). Further, the method of manufacture recited in (11) was successfully provided. Further, the lighting apparatus and the image display device having excellent features were successfully provided by implementing the configuration recited in any one from (12) to (20). The following (1) to (20) describes the above more specifically.

(1) A phosphor comprising: α-type sialon crystal as a main component, wherein the α-type sialon crystal comprises: at least an A element (here, A is one or more kinds of elements selected from Mn, Ce, Pr, Nd, Sm, Eu, Tb, Dy, Er, Tm, and Yb); an M element (here, M is one or more kinds of elements selected from Li, Na, Mg, Ca, Y, La, Gd, and Lu); Si; Al; oxygen; and nitrogen, wherein the α-sialon crystal is expressed by a general formula:

$$(M_x, A_y)(Si_{12-(m+n)}Al_{m+n})(O_nN_{16-n}) \quad (1), \text{ and}$$

$$m = \delta_M \times x + \delta_A \times y \quad (2),$$

wherein the α-sialon crystal (here, x is an amount of solid solution of M in a sialon unit cell, y is an amount of solid solution of A in the sialon unit cell, n is a content amount of oxygen in the sialon unit cell) is expressed by a composition formula having parameters x, y, and n, which are in a range expressed by:

$$0.2 \leq x \leq 2.4 \quad (3),$$

$$0.001 \leq y \leq 0.4 \quad (4), \text{ and}$$

$$0.5 \times m < n \leq 4 \quad (5).$$

(2) The phosphor according to the above (1), wherein the parameter n is in a range expressed by:

$$0.6 \times m \leq n \leq 2 \quad (6)$$

(3) The phosphor according to the above (1) or (2), wherein the M element is Ca, wherein the A element is Eu, and wherein the phosphor emits fluorescence having a peak in a wavelength range from 530 nm to 585 nm upon irradiation of an excitation source.

(4) The phosphor according to any one of the above (1) to (3), wherein the M element is Ca, wherein the A element is Eu, wherein the parameters m and n are in a range expressed by:

$$0.6 \leq m \leq 1.4 \quad (7), \text{ and}$$

$$0.8 \leq n \leq 2 \quad (8),$$

wherein the phosphor emits fluorescence having a peak in a wavelength range from 560 nm to 575 nm upon irradiation of an excitation source.

(5) The phosphor according to any one of the above (1) to (4), wherein the excitation source is a violet light or a visible light having a wavelength which is 100 nm or more and 500 nm or shorter.

(6) The phosphor according to any one of the above (1) to (5), wherein an emission color upon irradiation of the excitation source is represented by (x, y) values in the CIE Chromaticity coordinate and satisfies conditions:

$$0.3 \leq x \leq 0.5 \quad (9), \text{ and}$$

$$0.46 \leq y \leq 0.6 \quad (10)$$

(7) The phosphor according to any one of the above (1) to (6), comprises a primary particle of the sialon which is characterized by a diameter of 0.5 μm or more along a minor axis and an aspect ratio of 3 or more.

(8) The phosphor according to the above (1), comprises: an amorphous phase or another crystalline phase than the α-type sialon, wherein a content amount of the α-type sialon crystal is 10 mass % or more.

(9) The phosphor according to the above (8), wherein the content amount of the α-type sialon crystal is 50 mass % or more.

(10) The phosphor according to the above (8) or (9), wherein the amorphous phase or the other crystalline phase is inorganic substance having electronic conductivity.

(11) A method of manufacturing the phosphor recited in any one of the above (1) to (10) comprising: firing in a nitrogen atmosphere in a temperature range which is 1500 degree Celsius or higher and 2200 degree Celsius or lower a raw material mixture comprising: at least oxide of an M element (here, M is one or more kinds of elements selected from Li, Na, Mg, Ca, Y, La, Gd, and Lu); oxide of an A element (here, A is one or more kinds of elements selected from Mn, Ce, Pr, Nd, Sm, Eu, Tb, Dy, Er, Tm, and Yb); silicon nitride; aluminum nitride; and silicon oxide or aluminum oxide.

(12) A lighting apparatus comprising: an excitation source and a phosphor, wherein the phosphor comprises a phosphor recited in any one of the above (1) to (10).

(13) The lighting apparatus according to the above (12), wherein the excitation source comprises: an inorganic EL device; an organic EL device; a laser diode (LD); or a light-emitting diode (LED) to emit a light of wavelength from 330 to 500 nm.

(14) The lighting apparatus according to the above (12) or (13), wherein the excitation source is a LED or a LD which emits a light of wavelength from 330 to 420 nm, wherein the lighting apparatus comprises: the phosphor recited in any one of the above (1) to (10); a blue color phosphor having an emission peak in wavelength range of 450 nm to 500 nm by an excitation light of 330 nm to 420 nm; and a red color phosphor having an emission peak in wavelength range of 600 nm to 700 nm by an excitation light of 330 nm to 420 nm, and wherein the lighting apparatus emits a white light by mixing a blue light; a green light; and a red light.

(15) The lighting apparatus according to the above (12) or (13), wherein the excitation source is a LED or a LD which emits a light of wavelength from 430 to 480 nm; and wherein the lighting apparatus emits a white light by mixing a blue light of the excitation source and a yellow light of the phosphor.

(16) The lighting apparatus according to the above (12) or (13), wherein the excitation source is a LED or a LD which emits a light of wavelength from 430 to 480 nm, wherein the lighting apparatus comprises: the phosphor; and an orange or a red color phosphor (hereinafter, referred to as "second phosphor") having an emission peak in wavelength range of 580 nm to 700 nm by an excitation light of 430 nm to 480 nm, and wherein the lighting apparatus emits a white light by mixing a yellow light of the phosphor and an orange or red light of the second phosphor.

(17) The lighting apparatus according to the above (16), wherein the second phosphor is an Eu-activated $CaAlSiN_3$.

(18) The lighting apparatus according to the above (16), wherein the second phosphor is an Eu-activated Ca-α-sialon.

(19) An image display device comprising: the phosphor recited in any one of the above (1) to (10); and an excitation source of the phosphor.

(20) The image display device according to the above (19), wherein the excitation source is an electron beam, an electrical field, a vacuum ultraviolet ray, or an ultraviolet ray.

(21) The image display device according to the above (19) or (20), comprising: any of a fluorescent display (VFD), a field emission display (FED), a plasma display panel (PDP), or a cathode-ray tube (CRT).

The phosphor of the present invention is characterized by a high intensity and a small temperature fluctuation of the brightness since an inorganic compound is contained as a main component wherein the A element (Mn, Ce, Pr, Nd, Sm, Eu, Tb, Dy, Er, Tm, Yb) solid solves into the inorganic compound which comprises α-type sialon crystal having a specific nitrogen/oxygen content composition as a host. Further, the phosphor of a specific composition to which Eu or the like is added renders an emission of shorter wavelength than the conventional orange or yellow sialon phosphor so as to be superior as the yellow-green phosphor. Further, since the phosphor is chemically stable, the brightness does not deteriorate in particular even if the phosphor is exposed to the excitation source. A useful phosphor to be utilized in VFD, FED, PDP, CRT, white color LED, and so on is provided.

BRIEF DESCRIPTION OF THE DRAWINGS

FIG. 1 is a drawing showing values of m and n in examples.
FIG. 2 is a drawing showing emission intensities of phosphors (examples).
FIG. 3 is a drawing showing emission wavelengths of phosphors (examples).
FIG. 4 is a drawing showing a state of particles of a phosphor (Example 71).
FIG. 5 is a drawing showing a state of particles of a phosphor (Comparative example 1).
FIG. 6 is a drawing showing emission and excitation spectra of a phosphor (Example 29).
FIG. 7 is a drawing showing emission and excitation spectra of a phosphor (Comparative example 2).
FIG. 8 is a schematic drawing of a lighting apparatus (bullet-type LED lighting apparatus) according to the present invention.
FIG. 9 is a schematic drawing of a lighting apparatus (substrate-mounted LED lighting apparatus) according to the present invention.
FIG. 10 is a schematic drawing of an image display device (plasma display panel) according to the present invention.

DESCRIPTION OF REFERENCE NUMERALS 1 bullet-type light-emitting diode lamp
2, 3 lead wire
4 light emitting diode device
5 bonding wire
6, 8 resin
7 phosphor
21 tip-type white light-emitting diode lamp for mounting on a substrate
22, 23 lead wire
24 light emitting diode device
25 bonding wire
26, 28 resin
27 phosphor
29 alumina ceramics substrate
30 side surface member
31 red color phosphor
32 green color phosphor
33 blue color phosphor
34, 35, 36 ultraviolet ray emission cell
37, 38, 39, 40 electrode
41, 42 dielectric layer
43 protective layer
44, 45 glass substrate

BEST MODE TO CARRY OUT THE INVENTION

Hereafter, the present invention is described in detail. The phosphor of the present invention is a composition which includes at least an M element for stabilizing α-sialon, an activating A element, Si, Al, oxygen, and nitrogen, and includes an α-type sialon crystal as the main component. As a typical constituent element, A may be one or more kinds of elements selected from Mn, Ce, Pr, Nd, Sm, Eu, Tb, Dy, Er, Tm, and Yb. As a typical element, M may be one or more kinds of elements selected from Li, Na, Mg, Ca, Y, La, Gd, and Lu. The A element functions as a luminescence center which emits fluorescence upon receiving the energy from an excitation source, and emission color differs depending on an added element. Therefore, an appropriate element for addition may be selected in order to obtain a desired color out of emission colors in a wavelength region extending from 400 to 700 nm according to the use. In particular, an Eu-doped phosphor shows a yellow-green emission having a peak in a wavelength region of from 530 to 580 nm, and hence is particularly appropriate for building a white color LED in combination with a blue color LED. The M element solves into the sialon lattice to form the solid solution and contributes to stabilization of the crystal structure. The M element may be selected from optically inert elements.

An α-type sialon crystal containing the A element and the M element is represented by a general formula:

$$(M_x, A_y)(Si_{12-(m+n)}Al_{m+n})(O_n N_{16-n}).$$

The parameter m is a value determined by x and y, and has a relation:

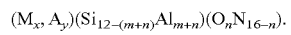

Here, $\delta_M$ is the valence of the M element, and for example, 1 for Li, 2 for Mg or Ca, and 3 for Y or La.

According to the present invention, the parameters x and y in the formula have values in the range:

$$0.2 \leq x \leq 2.4,$$

$$0.001 \leq y \leq 0.4, \text{ and}$$

$$0.5 \times m < n \leq 4.$$

The parameter x represents the number of M atoms which solid solve in the unit cell of sialon to form the solid solution. When x is smaller than 0.2, the α-sialon crystal is not stabilized so as to become β-sialon, thereby causing change of the emission color and reduction of the brightness. When x is larger than 2.4, crystalline phases other than the α-type sialon precipitate such that the reduction of the emission brightness may be caused. The parameter y represents the number of the A atoms as an activating element which solid solve in the unit cell of sialon to form the solid solution. When y is smaller than 0.001, the brightness is low because the number of optically active ions is too small, and when y is larger than 0.4, concentration quenching is caused by the interaction between the A atoms, thereby causing the reduction of the brightness.

The parameter n is a value related to the amount of the substitution-type solid solution of oxygen into the α-type $Si_3N_4$ structure and represents the number of oxygen atoms contained in a unit cell. Here, since the total number of oxygen atoms and nitrogen atoms which are contained in the unit cell is 16, the number of the nitrogen atoms contained in the unit cell is 16−n.

When the M element is monovalent and $Li_2O$ is used as a starting material, introduction of the number x of Li atoms into the crystal lattice results in introduction of the number 0.5×x of oxygen atoms. Thus, if an oxide is used as a starting material containing the M element, the number $0.5 \times \delta_M \times x$ of oxygen atoms are introduced. Here, $\delta_M$ is the valence of the M ion. That is, in the α-sialon which uses $Si_3N_4$, AlN and the oxide of M as the starting material, the following relation is given:

$$n=0.5 \times \delta_M \times x = 0.5 \times m.$$

In the present invention, the inventors paid attention to the amount of n in the crystal lattice and found that the emission wavelength could be made shorter and the brightness could be enhanced by adopting a composition which contains a larger amount of oxygen than a composition of n=0.5×m which has been conventionally synthesized as the host crystal of a phosphor. That is, the inventors have found that the emission wavelength could be made shorter as well as the brightness could be made higher in a composition in which the value of n is in the range of:

$$0.5 \times m < n \leq 4.$$

When the value of n is equal to or smaller than 0.5×m, the amount of oxygen in the crystal lattice is small, and the emission wavelength tends to become longer. When the value of n is larger than 4, the proportion of crystalline phases other than α-sialon becomes larger such that the emission intensity may be lowered.

The reason why the emission wavelength is made shorter and the brightness is made higher by increasing the amount of oxygen in the sialon lattice is inferred as follows. In an Eu-activated sialon phosphor, fluorescence is emitted when an $Eu^{2+}$ ion which has absorbed an excitation light renders a transition from the 5d orbital into the 4f orbital. Therefore, the color of the emission is determined by the energy levels of the $Eu^{2+}$ ion. If the amount of oxygen in the sialon is increased, the energy difference by the transition increases because the proportion of oxygen and nitrogen atoms which surround the $Eu^{2+}$ ion changes so as to lower the covalent nature, thereby causing the emission wavelength shorter. Moreover, the emission intensity may be made higher because of formation of large particles having excellent crystallinity since a large amount of liquid phase is generated during synthesis at a high temperature by increasing the oxygen amount so as to enhance reactivity.

In the present invention, a phosphor that contains sialon primary particles of a shape where a minor axis diameter thereof is 0.5 μm or larger and an aspect ratio thereof is 3 or larger shows a particularly high emission intensity. If the sialon primary particles are in the single crystal, the emission intensity is made even higher. Here, the aspect ratio means flatness and is defined as the ratio of the length of the major axis to that of the minor axis. Such a shape can be made by the reaction for a long period of time at the high temperature in a state where the large amount of liquid phase exists, that is, where the amount of n is large enough. The reaction time is preferably 24 hours or longer.

An especially high emission intensity may be achieved by a phosphor having a composition in which the above-mentioned value of n is in the range of:

$$0.6 \times m \leq n \leq 2.$$

The value of n can be made larger by replacing part of the AlN constituent serving as an aluminum source of the starting material with $Al_2O_3$, or part of the $Si_3N_4$ constituent serving as a Si source with $SiO_2$.

Since a phosphor of α-sialon containing Ca and being activated with Eu shows a high emission intensity, a phosphor which contains Ca as the M element and Eu as the A element may constitute a phosphor showing a high emission intensity. In particular, a phosphor in which the M element is Ca and the A element is Eu is more preferable for LED applications since such a phosphor emits fluorescence having a peak in the wavelength range from 530 nm to 585 nm.

In particular, a phosphor, in which the M element is Ca and the A element is Eu and the parameters m and n are in the range of:

$$0.6 \leq m \leq 1.4 \text{ and}$$

$$0.8 \leq n \leq 2,$$

emits fluorescence which has a peak in the wavelength range from 560 nm to 575 nm upon irradiation of the excitation source. Hence, it is especially preferable to apply the phosphor to a white color LED employing a blue color LED as an excitation source thereof.

As an excitation source, a light (vacuum ultraviolet ray, ultraviolet ray, or visible light) having a wavelength region of 100 nm or longer and 500 nm or shorter, and a radiation ray such as an electron beam, an X-ray, and a neutron beam can be named. Further, the phosphor may also be utilized for excitation (inorganic EL device) in the electric field.

When the phosphor of the present invention is utilized in a powder state, it is preferable that a mean particle diameter is in the range of 0.1 μm or larger and 50 μm or smaller in view of the dispersibility into the resin and the fluidity of the powder. In particular, the phosphor with the mean particle diameter of 5 μm or larger and 10 μm or smaller is excellent in handleability. Further, the emission brightness is enhanced if the phosphor in the powder state comprises single crystal particles with the mean particle diameter of 5 μm or larger and 10 μm or smaller.

In order to obtain a phosphor having a high emission brightness, the amount of impurities contained in the α-type sialon crystals is preferably minimized as much as possible. In particular, it is desirable to select a raw material powder and control a synthesis process so that the total amount of impurity elements such as Fe, Co, and Ni is 500 ppm or less since the light emission is quenched if a large amount of impurity elements are contained.

In the present invention, it is desirable that the phosphor contains as much α-type sialon crystal of high purity as possible and it is even more desirable that the α-type sialon crystal comprises a single phase from the viewpoint of the fluorescence emission. However, it is possible for the phosphor to contain a mixture with another crystalline phase or an amorphous phase within a range where characteristics thereof are not lowered. In this case, it is desirable that the content of the α-type sialon crystals is 10 mass % or larger in order to obtain the high brightness thereof. More preferably, when the content is maintained at 50 mass % or higher, the brightness improves remarkably. In the present invention, as the range of the main component, the content of the α-type sialon crystal is at least 10 mass % or larger. The content of the α-type sialon crystal can be determined based on the multiphase analysis by the Rietveld method as the X-ray diffraction measurement is performed. In a simpler way, the content can be obtained from the ratios among the respective heights of the strongest lines of the α-type sialon crystal and the other crystals by utilizing the X-ray diffraction results.

It is possible to provide the electrical conductivity to the phosphor of the present invention by mixing inorganic substances having the electrical conductivity into the phosphor if the phosphor is applied to the field where the phosphor is excited by an electron beam. As the inorganic substance having the electrical conductivity, oxide, oxynitride, nitride, or a combination thereof of one or more kinds of elements selected from Zn, Al, Ga, In, and Sn may be named.

The phosphor of the present invention emits fluorescence of a specific color of the wavelength region of from 530 nm to 585 nm. If it is necessary to mix the specific color with other colors, it is possible to mix it with other inorganic phosphors which emit fluorescence of the other colors.

The phosphor of the present invention obtained as described above is characterized in that its excitation source ranges more widely from an electron beam, an X-ray, and an ultraviolet ray to a visible light as opposed to an ordinary oxide phosphor or the conventional sialon phosphor and that the phosphor of the present invention emits the fluorescence of the wavelength region of from 530 nm to 585 nm and, in particular, the fluorescence of a yellow-green color, if it has a specific composition, of the wavelength region of from 530 nm to 585 nm, which may be the yellow-green color expressed by (x, y) in the CIE Chromaticity coordinate with the relationship:

$0.3 \leq x \leq 0.5$, and $0.46 \leq y \leq 0.6$.

By utilizing the aforementioned emission characteristics, the phosphor of the present invention is preferably applied to the lighting apparatus and the image display device. In addition, the phosphor of the present invention shows only a small fluctuation in the emission brightness as the temperature changes and demonstrates an excellent long-term stability in an oxidizing atmosphere and hydric environment.

Although the method of manufacturing the phosphor of the present invention is not prescribed, a phosphor having high brightness can be manufactured by the following method.

The phosphor of high-brightness is obtained by firing a raw material mixture containing at least oxide of M (wherein M is one or more kinds of elements selected from Li, Na, Mg, Ca, Y, La, Gd, and Lu), oxide of A (wherein A is one or more kinds of elements selected from Mn, Ce, Pr, Nd, Sm, Eu, Tb, Dy, Er, Tm, and Yb), silicon nitride, aluminum nitride, and silicon oxide or aluminum oxide in a nitrogen atmosphere in the temperature range of 1500° C. or higher and 2200° C. or lower.

When the phosphor containing Ca, Eu, Si, Al, O, and N is synthesized, the starting material may be a mixture of silicon nitride, aluminum nitride, aluminum oxide or silicon oxide, a compound which becomes calcium oxide in the firing process (an addition amount of the compound is calculated by converting the equivalent amount of CaO), and europium oxide or a compound which becomes europium oxide in the firing process (an addition amount of the compound is calculated by converting the equivalent amount of EuO).

It is likely to obtain a stable α-type sialon and a phosphor of high brightness when the firing is conducted in a nitrogen atmosphere of a pressure range of 0.1 MPa or higher and 100 MPa or lower. It is likely that silicon nitride as a raw material is decomposed at a high firing temperature when the gas pressure is less than 0.1 MPa. And the gas pressure higher than 100 MPa leads high cost such that it is not preferable in view of the industrial productivity.

The above-mentioned mixed powder of metal compounds may be fired in a state where the packing fraction is kept at a bulk density of 40% or lower. The bulk density refers to the volume packing fraction of powder and is a value given by dividing the ratio of mass of the powder filled in a certain vessel to the volumetric capacity of the vessel by the theoretical density of the metal compounds. Since the reactivity of a boron nitride sintered compact with the metal compounds is low, the boron nitride sintered compact is suitable for the vessel.

The reason why the firing process is conducted as the bulk density is kept to be 40% or lower is that it is readily to synthesize crystals with a small amount of surface defects. That is, it is plausible that the crystals with the small amount of surface defects can be synthesized since contacts between crystals become less as the crystals grow with reaction products if the firing process is conducted in a state where more free space is provided around the raw material powder.

Next, the phosphor is synthesized by firing the thus-obtained mixture of the metal compounds in an inert atmosphere containing nitrogen in a temperature range of 1200° C. or higher and 2200° C. or lower. Since the firing temperature is high and the firing atmosphere is an inert atmosphere containing nitrogen, an electric furnace of a metal resistance heating type or a graphite resistance heating type, in which a high temperature member of the furnace made of carbon is used, is suitable. As the firing method, a sintering method such as a pressureless sintering method or a gas-pressure sintering method in which no mechanical pressure is applied from the outside is preferable since it is possible to conduct the firing as the bulk density is kept high in such a method.

When a powder aggregate obtained by the firing is firmly solidified, the powder aggregate is milled by a pulverizer usually used in the industry such as a ball mill and a jet mill. The milling is made until a mean particle diameter of 50 μm or smaller is attained. The mean particle diameter of from 0.1 μm to 5 μm is particularly preferable. If the mean particle diameter exceeds 50 μm, the fluidity of the powder and the dispersibility of the powder to resin tend to be inferior. Consequently, when a light emitting device is made by combining a light-emitting element, the emission intensity tends to become nonuniform depending on a portion of the element. If the mean particle diameter becomes smaller than 0.1 μm, the number of defects on the phosphor powder surface increases such that the emission intensity might be lowered depending on the composition of the phosphor.

If the phosphor powder after firing, the phosphor powder after milling treatment, or the phosphor powder after particle size adjustment is heat-treated in a temperature range of 1000° C. or higher and equal to or lower than the firing temperature, the defects introduced on the surface at the time of milling and the like decrease such that the brightness is improved.

By washing the product with water or a solvent constituted of an aqueous solution of an acid after the firing process, the content of a glass phase, a secondary phase, or an impurity phase contained in the product can be reduced, and the brightness is enhanced. In this case, the acid can be selected from one kind of substance or a mixture of sulfuric acid, hydrochloric acid, nitric acid, hydrofluoric acid, and organic acid. In particular, a mixture of hydrofluoric acid and sulfuric acid shows a pronounced effect on removing impurities.

As explained above, since the phosphor of the present invention shows higher brightness than the conventional sialon phosphor and smaller decline of the brightness of the phosphor when the phosphor is exposed to the excitation source, the phosphor is suitable for a VFD, an FED, a PDP, a CRT, a white color LED, and the like and, in particular, is suitable for the white color LED if it is combined with a blue color LED.

The lighting apparatus of the present invention comprises at least a light source and the phosphor of the present invention to be used therein. The lighting apparatus includes an LED lighting apparatus, an electroluminescence lighting apparatus, a fluorescent lamp, and the like. The LED lighting apparatus can be manufactured using the phosphor of the present invention by a publicly known method which is described in the Japanese Patent Laid-open Publication No. H05-152609, Japanese Patent Laid-open Publication No. H07-99345, Japanese Patent No. 2927279, and the like. In this case, the light source is preferably what emits a light of a wavelength region of from 330 to 500 nm. In particular, an LED light-emitting device emitting an ultraviolet (or violet) ray of a wavelength region of from 330 to 420 nm, or an LED light-emitting device emitting a blue light in a wavelength region of from 420 to 480 nm is especially preferred.

Such LED light-emitting devices include a nitride semiconductor such as GaN or InGaN, which can be a light source emitting a light of a predetermined wavelength by adjusting the composition.

In addition to the method of applying the phosphor of the present invention alone to the lighting apparatus, the lighting apparatus which emits a light of a desired color can be constructed by using another phosphor having other luminescence characteristics together with the phosphor of the present invention. As an example of the above-mentioned lighting apparatus, there is a lighting apparatus which emits a white light produced by mixing the blue light, the green light, and the red light by utilizing an ultraviolet LED light-emitting device emitting a light of 330 to 420 nm, a blue color phosphor which is excited by the light of this wavelength region so as to emit a light of the wavelength region which is 450 nm or longer and 500 nm or shorter, the yellow-green color phosphor of the present invention, and a red color phosphor which emits a light of the wavelength region of from 600 nm to 700 nm as it is excited by an excitation light of 330 to 420 nm. As such a blue color phosphor and a red color phosphor, $BaMgAl_{10}O_{17}$:Eu and Eu-activated $CaAlSiN_3$ can be mentioned, respectively.

As another method, an LED light-emitting device which emits a blue light of a wavelength region of from 430 to 480 nm and the phosphor of the present invention may be combined. In this configuration, there is a lighting apparatus which emits a white light. When the blue light emitted by the LED is irradiated onto the phosphor, a yellow light is emitted such that this yellow light is mixed with the blue light of the LED itself so as to make the white light.

In another way, there is a lighting apparatus which emits a white light. An LED light-emitting device which emits a blue light of the wavelength region of from 430 to 480 nm, the phosphor of the present invention, and an orange or red color phosphor which shows a light emission peak in the wavelength region of from 580 nm to 700 nm by the excitation light of the wavelength region of from 430 to 480 nm are used such that the blue light of the excitation light source, the yellow light of the phosphor, and the orange or red light of the orange or red color phosphor are mixed so as to produce the white light. As the red color phosphor and the orange phosphor, Eu-activated $CaAlSiN_3$ and Eu-activated Ca-α-sialon can be mentioned, respectively.

The image display device of the present invention comprises at least an excitation source and the phosphor of the present invention and includes a vacuum fluorescent display (VFD), a field emission display (FED or SED), a plasma display panel (PDP), a cathode-ray tube (CRT), and the like. It was confirmed that the phosphor of the present invention emits a light by the excitation light of a vacuum ultraviolet ray of wavelength of from 100 to 190 nm, an ultraviolet ray of wavelength of from 190 to 380 nm, an electron beam, or the like. The above-mentioned image display devices can be constructed by combining the excitation source and the phosphor of the present invention.

EXAMPLE

In the following, the present invention is described in more detail with reference to examples as described below. However, these examples are disclosed as a help for easy understanding of the present invention and the present invention is not limited to these examples.

Examples 1-70

In α-type sialon containing Ca and Eu, compositions having values of design parameters x, y, m, and n; and values of x, y, a, b, c, and d in a $Ca_xEu_ySi_aAl_bO_cN_d$ material composition (Tables 1-1, 1-2, 2-1, and 2-2) were examined. The parameters of the design compositions of Examples 1 to 70 are shown in Table 1-1, Table 1-2, Table 2-1, and Table 2-2, respectively. The values of m and n of the compositions are shown in FIG. 1. Based on these designs, calcium carbonate powder, europium oxide powder, silicon nitride powder, aluminum nitride powder, and aluminum oxide powder were mixed according to the compositions as shown in Tables 4-1 and 4-2 in order to obtain the design compositions as shown in Table 3-1 and Table 3-2. Here, Tables 4-1 and 4-2 show the mixture compositions of Examples 1 to 70. Raw material powders used to obtain the mixture are: calcium carbonate powder ($CaCO_3$; manufactured by Kojundo Chemical Laboratory Co., Ltd.); europium oxide ($Eu_2O_3$; purity 99.9%, manufactured by Shin-Etsu Chemical Co., Ltd.); silicon nitride powder having a particle size of a specific surface area of 11.2 $m^2$/g, containing 1.29 wt % of oxygen, and containing 95% α-type silicon nitride (SN-E10 grade manufactured by Ube Industries, Ltd.); aluminum nitride powder having a particle size of a specific surface area of 3.3 $m^2$/g, containing 0.85 wt % of oxygen (F grade manufactured by Tokuyama Corporation); and aluminum oxide powder of a particle size of a specific surface area of 13.6 $m^2$/g (Taimicron grade manufactured by Taimei Chemicals Co., Ltd.). These kinds of powders were weighed so as to obtain each of the mixture compositions of Tables 4-1 and 4-2, and mixed in the air for 10 minutes by using an agate pestle and an agate mortar. Then, each of the thus-obtained mixtures was sifted through a sieve of 500 μm and allowed to fall naturally into a boron nitride crucible such that the powder was filled in the crucible. The bulk densities of the powders were about 25% to 30%.

The crucible containing the mixed powder was placed in an electric furnace of a graphite resistance heating type. In the operation of firing, first a firing atmosphere was made in a vacuum by a diffusion pump and the mixed powder contained in the crucible was heated from the room temperature to 800° C. at a rate of 500° C. per hour. Nitrogen gas having 99.999 volume % purity was introduced at 800° C. to raise the pressure of the atmosphere up to 0.5 MPa and then the temperature was further raised up to 1700° C. at a rate of 500° C. per hour. Then, the temperature was kept for 2 hours.

Subsequently, the synthesized compounds were ground by using an agate mortar, and a powder X-ray diffraction measurement was conducted using the Cu $K_\alpha$ ray. Then, no unreacted $Si_3N_4$, AlN, $Al_2O_3$, $CaCO_3$, CaO, EuO, and $Eu_2O_3$ was detected such that it was confirmed that all examples contained 60% or more of α-type sialon.

After the firing process, the resultant fired product was ground by hand using a mortar and a crucible made of sintered silicon nitride after being crushed coarsely and then sifted through a 30 μm-mesh sieve. The mean particle diameter of each ground product ranged from 7 to 12 μm.

Here, in this specification, the mean particle diameter is defined as follows. In the measurement by the sedimentation method, the particle diameter is defined as a diameter of an equivalent sphere having the same sedimentation rate, and in the laser scattering method, it is defined as a diameter of an equivalent sphere having the same scattering characteristics. Further, the distribution of particle diameters is called a particle size (particle diameter) distribution. In the particle diameter distribution, a specified particle diameter is defined as a mean particle diameter D50 when the total mass of powder particles having diameters larger than the specified particle diameter is 50% of the total mass of the entire powder body. These definition and term are well known to the one skilled in the art and are described in various documents such as JIS Z 8901 "Powder Body for Test and Particle for Test" and the first chapter of "Basic Physical Properties of Powder" edited by The Society of Powder Technology, Japan (ISBN4-526-05544-1) In the present invention, a specimen was dispersed in water in which sodium hexamethaphosphate was added as a dispersing agent. Then, the volume-converted integrated frequency distribution of the particle diameters was measured by using a laser scattering-type measurement instrument. Here, the volume-converted distribution is identical to the weight-converted distribution. The particle diameter corresponding to that at 50% in the integrated (cumulative) frequency distribution was obtained and defined as the mean particle diameter D50. It should be noted that, in the following part of this specification, the mean particle diameter is based on the median value (D50) of the particle size distribution measured with a particle size distribution measurement means by the above-mentioned laser scattering method. As to a means for determining the mean particle diameter, various kinds of means have been developed and the development is still being performed such that the value measured by a newly developed means may differ slightly. However, it should be understood that the meaning and significance of the mean particle diameter itself is definite, and the means for measuring the mean particle diameter is not necessarily limited to the above-mentioned means.

As a result of irradiating a light of wavelength of 365 nm onto theses these powder samples using a lamp which emits the light, it was confirmed that these powder samples emit lights of yellow-green color to yellow color. Tables 5-1 and 5-2 and FIGS. 2 and 3 show results obtained by measuring emission spectra and excitation spectra of these powder samples by using a spectrophotofluorometer. The peak wavelengths and peak intensities of the excitation and emission spectra of Examples 1 to 70 are shown in Tables 5-1 and 5-2. In all examples, phosphors which were efficiently excited by an ultraviolet ray, a violet light, and a blue light of a wavelength region of from 300 nm to 450 nm and emitted yellow-green fluorescence having a peak in the wavelength region of from 530 nm to 585 nm. Here, since the counted values vary depending on the measuring instruments and conditions, the unit of the values is an arbitrary unit. That is, comparisons thereof can be made only within the present examples and comparative examples measured in the same conditions.

Example 71 and Comparative Example 1

A raw material powder mixture having the same composition as Example 29 (m=1, n=1.8) was prepared in the same processes as those of Example 29. The resultant mixture was heated from the room temperature to 800° C. at a rate of 500° C. per hour, and nitrogen gas having a purity of 99.999 volume % was introduced at 800° C. to adjust the pressure to 0.5 MPa. Then, the temperature was further raised to 1700° C. at a rate of 500° C. per hour and kept at 1700° C. for 24 hours to synthesize the compound. Next, the synthesized compound was ground by using an agate mortar and the compound was examined by a powder X-ray diffraction measurement using the Cu $K_\alpha$ ray such that it was confirmed that α-type sialon was produced.

The shape of the synthesized phosphor powder particles was observed with a scanning electron microscope (SEM). As shown in FIG. 4, it was confirmed that the phosphor particles were primary particles comprising single crystal particles having well-developed crystal faces and a length of about 3 μm. The actual phosphor was obtained in a state that these primary particles were aggregated. For comparison, the SEM picture of a specimen (Comparative example 1) having a sialon composition of $((Ca_{0.4625}Eu_{0.0375})Si_{10.5}Al_{1.5}O_{0.5}N_{15.5})$, in which m=1 and n=0.5, that was fired in the same firing conditions as Example 71 is shown in FIG. 5. It was confirmed that the amount of the liquid phase produced during the firing process was small since the value of n was small and hence particle growth was insufficient and the particles were small. The maximum intensity of the emission spectrum of this phosphor is 5,100 counts. That is, even in a composition where the value of m was small, the amount of generated liquid phase was increased by making the value of n larger such that the crystal growth was promoted and then the emission intensity of the phosphor was enhanced.

As a result of irradiating a light of a wavelength of 365 nm onto the ground powder with a lamp which emits the light, the yellow-green light emission was confirmed. FIG. 6 shows results obtained by measuring emission spectra and excitation spectra of this powder specimen with the spectrophotofluorometer. It turned out that the peak wavelength of the excitation spectrum was 445 nm. A phosphor emitting the yellow-green fluorescence having a peak in the wavelength region of 574 nm by this excitation was obtained. This phosphor can be excited by the excitation light of a broad region extending from 250 nm to 500 nm. In particular, it was found that the phosphor was characterized in that the excitation intensities of a violet color LED in the wavelength of 405 nm and a blue color LED in the wavelength of 450 nm were especially high. The color coordinates of the fluorescence were x=0.47 and y=0.52 and indicated a yellow-green color.

Comparative Example 2

In order to synthesize Eu-activated Ca-α-sialon of

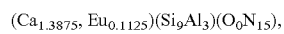

$(Ca_{1.3875}, Eu_{0.1125})(Si_9Al_3)(O_0N_{15})$, in which the parameters m=3 and n=0, from the same raw material powders as the examples, a $Ca_3N_2$ powder (99% purity manufactured by Cerac, Inc.), an EuN powder (laboratory-synthesized) having been prepared by nitriding metallic Eu at 600° C. in an ammonia gaseous stream, a $Si_3N_4$ powder identical to that used for the examples, and an AlN powder identical to that used for the examples were mixed as the mixed raw material powders at the following mixed compositions:

$Ca_3N_2$:EuN:$Si_3N_4$:AlN=7.03:1.71:45.63:45.63 (mol %); and $Ca_3N_2$:EuN:$Si_3N_4$:AlN=10.87:2.96:66.69:19.49 (mass %) in an ambient atmosphere containing equal to or less than 1 ppm of oxygen and moisture in the glove box and the mixed raw material powders were treated in the same processes as described for the examples so as to synthesize the phosphor.

According to the X-ray diffraction measurement, α-type sialon was detected in the synthesized compound, but no other crystalline phases were detected. FIG. 7 shows emission and excitation spectra of the powder sample measured with the spectrophotofluorometer. The emission wavelength of the phosphor was 604 nm and emission intensity was 6209. The composition of the comparative example was out of the composition range of the present invention, and hence was unsuitable. Consequently, the emission wavelength of the obtained phosphor was longer than that of the present invention. The color coordinates of the fluorescence were x=0.55 and y=0.45, and indicated an orange color.

TABLE 1-1

| | Parameter | | Designed Composition (# of atoms in unit cell) | | | | | |
|---|---|---|---|---|---|---|---|---|
| Example | m | n | Ca(x) | Eu(y) | Si | Al | O | N |
| 1 | 0.5 | 0.5 | 0.2313 | 0.0188 | 11.00 | 1.00 | 0.50 | 15.50 |
| 2 | 0.5 | 0.6 | 0.2313 | 0.0188 | 10.90 | 1.10 | 0.60 | 15.40 |
| 3 | 0.5 | 0.7 | 0.2313 | 0.0188 | 10.80 | 1.20 | 0.70 | 15.30 |
| 4 | 0.5 | 0.8 | 0.2313 | 0.0188 | 10.70 | 1.30 | 0.80 | 15.20 |
| 5 | 0.5 | 1 | 0.2313 | 0.0188 | 10.50 | 1.50 | 1.00 | 15.00 |
| 6 | 0.5 | 1.2 | 0.2313 | 0.0188 | 10.30 | 1.70 | 1.20 | 14.80 |
| 7 | 0.5 | 1.4 | 0.2313 | 0.0188 | 10.10 | 1.90 | 1.40 | 14.60 |
| 8 | 0.5 | 1.5 | 0.2313 | 0.0188 | 10.00 | 2.00 | 1.50 | 14.50 |
| 9 | 0.5 | 1.6 | 0.2313 | 0.0188 | 9.90 | 2.10 | 1.60 | 14.40 |
| 10 | 0.5 | 1.8 | 0.2313 | 0.0188 | 9.70 | 2.30 | 1.80 | 14.20 |
| 11 | 0.75 | 0.5 | 0.3469 | 0.0281 | 10.75 | 1.25 | 0.50 | 15.50 |
| 12 | 0.75 | 0.6 | 0.3469 | 0.0281 | 10.65 | 1.35 | 0.60 | 15.40 |
| 13 | 0.75 | 0.7 | 0.3469 | 0.0281 | 10.55 | 1.45 | 0.70 | 15.30 |
| 14 | 0.75 | 0.8 | 0.3469 | 0.0281 | 10.45 | 1.55 | 0.80 | 15.20 |
| 15 | 0.75 | 1 | 0.3469 | 0.0281 | 10.25 | 1.75 | 1.00 | 15.00 |
| 16 | 0.75 | 1.2 | 0.3469 | 0.0281 | 10.05 | 1.95 | 1.20 | 14.80 |
| 17 | 0.75 | 1.4 | 0.3469 | 0.0281 | 9.85 | 2.15 | 1.40 | 14.60 |
| 18 | 0.75 | 1.5 | 0.3469 | 0.0281 | 9.75 | 2.25 | 1.50 | 14.50 |
| 19 | 0.75 | 1.6 | 0.3469 | 0.0281 | 9.65 | 2.35 | 1.60 | 14.40 |
| 20 | 0.75 | 1.8 | 0.3469 | 0.0281 | 9.45 | 2.55 | 1.80 | 14.20 |
| 21 | 1 | 0.6 | 0.4625 | 0.0375 | 10.40 | 1.60 | 0.60 | 15.40 |
| 22 | 1 | 0.7 | 0.4625 | 0.0375 | 10.30 | 1.70 | 0.70 | 15.30 |
| 23 | 1 | 0.8 | 0.4625 | 0.0375 | 10.20 | 1.80 | 0.80 | 15.20 |
| 24 | 1 | 1 | 0.4625 | 0.0375 | 10.00 | 2.00 | 1.00 | 15.00 |
| 25 | 1 | 1.2 | 0.4625 | 0.0375 | 9.80 | 2.20 | 1.20 | 14.80 |
| 26 | 1 | 1.4 | 0.4625 | 0.0375 | 9.60 | 2.40 | 1.40 | 14.60 |
| 27 | 1 | 1.5 | 0.4625 | 0.0375 | 9.50 | 2.50 | 1.50 | 14.50 |
| 28 | 1 | 1.6 | 0.4625 | 0.0375 | 9.40 | 2.60 | 1.60 | 14.40 |
| 29 | 1 | 1.8 | 0.4625 | 0.0375 | 9.20 | 2.80 | 1.80 | 14.20 |
| 30 | 1.5 | 0.8 | 0.6938 | 0.0563 | 9.70 | 2.30 | 0.80 | 15.20 |
| 31 | 1.5 | 1 | 0.6938 | 0.0563 | 9.50 | 2.50 | 1.00 | 15.00 |
| 32 | 1.5 | 1.2 | 0.6938 | 0.0563 | 9.30 | 2.70 | 1.20 | 14.80 |
| 33 | 1.5 | 1.4 | 0.6938 | 0.0563 | 9.10 | 2.90 | 1.40 | 14.60 |
| 34 | 1.5 | 1.5 | 0.6938 | 0.0563 | 9.00 | 3.00 | 1.50 | 14.50 |
| 35 | 1.5 | 1.6 | 0.6938 | 0.0563 | 8.90 | 3.10 | 1.60 | 14.40 |
| 36 | 1.5 | 1.8 | 0.6938 | 0.0563 | 8.70 | 3.30 | 1.80 | 14.20 |
| 37 | 2 | 1.2 | 0.9250 | 0.0750 | 8.80 | 3.20 | 1.20 | 14.80 |
| 38 | 2 | 1.4 | 0.9250 | 0.0750 | 8.60 | 3.40 | 1.40 | 14.60 |

TABLE 1-2

| | Parameter | | Designed Composition | | | | | |
|---|---|---|---|---|---|---|---|---|
| Example | m | n | Ca (x) | Eu (y) | Si | Al | O | N |
| 39 | 2 | 1.5 | 0.9250 | 0.0750 | 8.50 | 3.50 | 1.50 | 14.50 |
| 40 | 2 | 1.6 | 0.9250 | 0.0750 | 8.40 | 3.60 | 1.60 | 14.40 |
| 41 | 2 | 1.8 | 0.9250 | 0.0750 | 8.20 | 3.80 | 1.80 | 14.20 |
| 42 | 0.5 | 1 | 0.2313 | 0.0188 | 10.50 | 1.50 | 1.00 | 15.00 |
| 43 | 0.75 | 1 | 0.3469 | 0.0281 | 10.25 | 1.75 | 1.00 | 15.00 |
| 44 | 1 | 1 | 0.4625 | 0.0375 | 10.00 | 2.00 | 1.00 | 15.00 |
| 45 | 1.2 | 1 | 0.5550 | 0.0450 | 9.80 | 2.20 | 1.00 | 15.00 |
| 46 | 1.4 | 1 | 0.6475 | 0.0525 | 9.60 | 2.40 | 1.00 | 15.00 |
| 47 | 1.6 | 1 | 0.7400 | 0.0600 | 9.40 | 2.60 | 1.00 | 15.00 |
| 48 | 1.8 | 1 | 0.8325 | 0.0675 | 9.20 | 2.80 | 1.00 | 15.00 |
| 49 | 0.5 | 1.5 | 0.2313 | 0.0188 | 10.00 | 2.00 | 1.50 | 14.50 |
| 50 | 0.75 | 1.5 | 0.3469 | 0.0281 | 9.75 | 2.25 | 1.50 | 14.50 |
| 51 | 1 | 1.5 | 0.4625 | 0.0375 | 9.50 | 2.50 | 1.50 | 14.50 |
| 52 | 1.2 | 1.5 | 0.5550 | 0.0450 | 9.30 | 2.70 | 1.50 | 14.50 |
| 53 | 1.4 | 1.5 | 0.6475 | 0.0525 | 9.10 | 2.90 | 1.50 | 14.50 |
| 54 | 1.6 | 1.5 | 0.7400 | 0.0600 | 8.90 | 3.10 | 1.50 | 14.50 |
| 55 | 1.8 | 1.5 | 0.8325 | 0.0675 | 8.70 | 3.30 | 1.50 | 14.50 |
| 56 | 2 | 1.5 | 0.9250 | 0.0750 | 8.50 | 3.50 | 1.50 | 14.50 |
| 57 | 2.2 | 1.5 | 1.0175 | 0.0825 | 8.30 | 3.70 | 1.50 | 14.50 |
| 58 | 2.4 | 1.5 | 1.1100 | 0.0900 | 8.10 | 3.90 | 1.50 | 14.50 |
| 59 | 2.6 | 1.5 | 1.2025 | 0.0975 | 7.90 | 4.10 | 1.50 | 14.50 |
| 60 | 2.8 | 1.5 | 1.2950 | 0.1050 | 7.70 | 4.30 | 1.50 | 14.50 |
| 61 | 0.5 | 1.7 | 0.2313 | 0.0188 | 9.80 | 2.20 | 1.70 | 14.30 |
| 62 | 0.75 | 1.7 | 0.3469 | 0.0281 | 9.55 | 2.45 | 1.70 | 14.30 |
| 63 | 1 | 1.7 | 0.4625 | 0.0375 | 9.30 | 2.70 | 1.70 | 14.30 |
| 64 | 1.2 | 1.7 | 0.5550 | 0.0450 | 9.10 | 2.90 | 1.70 | 14.30 |
| 65 | 1.4 | 1.7 | 0.6475 | 0.0525 | 8.90 | 3.10 | 1.70 | 14.30 |
| 66 | 1.6 | 1.7 | 0.7400 | 0.0600 | 8.70 | 3.30 | 1.70 | 14.30 |
| 67 | 1.8 | 1.7 | 0.8325 | 0.0675 | 8.50 | 3.50 | 1.70 | 14.30 |
| 68 | 2 | 1.7 | 0.9250 | 0.0750 | 8.30 | 3.70 | 1.70 | 14.30 |
| 69 | 2.2 | 1.7 | 1.0175 | 0.0825 | 8.10 | 3.90 | 1.70 | 14.30 |
| 70 | 2.4 | 1.7 | 1.1100 | 0.0900 | 7.90 | 4.10 | 1.70 | 14.30 |

TABLE 2-1

| | Designed Composition (atom %) | | | | | |
|---|---|---|---|---|---|---|
| Example | Ca | Eu | Si | Al | O | N |
| 1 | 0.8186 | 0.0664 | 38.9381 | 3.5398 | 1.7699 | 54.8673 |
| 2 | 0.8186 | 0.0664 | 38.5841 | 3.8938 | 2.1239 | 54.5133 |
| 3 | 0.8186 | 0.0664 | 38.2301 | 4.2478 | 2.4779 | 54.1593 |
| 4 | 0.8186 | 0.0664 | 37.8761 | 4.6018 | 2.8319 | 53.8053 |
| 5 | 0.8186 | 0.0664 | 37.1681 | 5.3097 | 3.5398 | 53.0973 |
| 6 | 0.8186 | 0.0664 | 36.4602 | 6.0177 | 4.2478 | 52.3894 |
| 7 | 0.8186 | 0.0664 | 35.7522 | 6.7257 | 4.9558 | 51.6814 |
| 8 | 0.8186 | 0.0664 | 35.3982 | 7.0796 | 5.3097 | 51.3274 |
| 9 | 0.8186 | 0.0664 | 35.0442 | 7.4336 | 5.6637 | 50.9735 |
| 10 | 0.8186 | 0.0664 | 34.3363 | 8.1416 | 6.3717 | 50.2655 |
| 11 | 1.2225 | 0.0991 | 37.8855 | 4.4053 | 1.7621 | 54.6256 |
| 12 | 1.2225 | 0.0991 | 37.5330 | 4.7577 | 2.1145 | 54.2731 |
| 13 | 1.2225 | 0.0991 | 37.1806 | 5.1101 | 2.4670 | 53.9207 |
| 14 | 1.2225 | 0.0991 | 36.8282 | 5.4626 | 2.8194 | 53.5683 |
| 15 | 1.2225 | 0.0991 | 36.1233 | 6.1674 | 3.5242 | 52.8634 |
| 16 | 1.2225 | 0.0991 | 35.4185 | 6.8722 | 4.2291 | 52.1586 |
| 17 | 1.2225 | 0.0991 | 34.7137 | 7.5771 | 4.9339 | 51.4537 |
| 18 | 1.2225 | 0.0991 | 34.3612 | 7.9295 | 5.2863 | 51.1013 |
| 19 | 1.2225 | 0.0991 | 34.0088 | 8.2819 | 5.6388 | 50.7489 |
| 20 | 1.2225 | 0.0991 | 33.3040 | 8.9868 | 6.3436 | 50.0441 |
| 21 | 1.6228 | 0.1316 | 36.4912 | 5.6140 | 2.1053 | 54.0351 |
| 22 | 1.6228 | 0.1316 | 36.1404 | 5.9649 | 2.4561 | 53.6842 |
| 23 | 1.6228 | 0.1316 | 35.7895 | 6.3158 | 2.8070 | 53.3333 |
| 24 | 1.6228 | 0.1316 | 35.0877 | 7.0175 | 3.5088 | 52.6316 |
| 25 | 1.6228 | 0.1316 | 34.3860 | 7.7193 | 4.2105 | 51.9298 |
| 26 | 1.6228 | 0.1316 | 33.6842 | 8.4211 | 4.9123 | 51.1281 |
| 27 | 1.6228 | 0.1316 | 33.3333 | 8.7719 | 5.2632 | 50.8772 |
| 28 | 1.6228 | 0.1316 | 32.9825 | 9.1228 | 5.6140 | 50.5263 |
| 29 | 1.6228 | 0.1316 | 32.2807 | 9.8246 | 6.3158 | 49.8246 |
| 30 | 2.4130 | 0.1957 | 33.7391 | 8.0000 | 2.7826 | 52.8696 |
| 31 | 2.4130 | 0.1957 | 33.0435 | 8.6957 | 3.4783 | 52.1739 |
| 32 | 2.4130 | 0.1957 | 32.3478 | 9.3913 | 4.1739 | 51.4783 |
| 33 | 2.4130 | 0.1957 | 31.6522 | 10.0870 | 4.8696 | 50.7826 |
| 34 | 2.4130 | 0.1957 | 31.3043 | 10.4348 | 5.2174 | 50.4348 |
| 35 | 2.4130 | 0.1957 | 30.9565 | 10.7826 | 5.5652 | 50.0870 |
| 36 | 2.4130 | 0.1957 | 30.2609 | 11.4783 | 6.2609 | 49.3913 |
| 37 | 3.1897 | 0.2586 | 30.3448 | 11.0345 | 4.1379 | 51.0345 |
| 38 | 3.1897 | 0.2586 | 29.6552 | 11.7241 | 4.8276 | 50.3448 |

TABLE 2-2

| | Designed Composition (atom %) | | | | | |
|---|---|---|---|---|---|---|
| Example | Ca | Eu | Si | Al | O | N |
| 39 | 3.1897 | 0.2586 | 29.3103 | 12.0690 | 5.1724 | 50.0000 |
| 40 | 3.1897 | 0.2586 | 28.9655 | 12.4138 | 5.5172 | 49.6552 |
| 41 | 3.1897 | 0.2586 | 28.2759 | 13.1034 | 6.2069 | 48.9655 |
| 42 | 0.8186 | 0.0664 | 37.1681 | 5.3097 | 3.5398 | 53.0973 |
| 43 | 1.2225 | 0.0991 | 36.1233 | 6.1674 | 3.5242 | 52.8634 |
| 44 | 1.6228 | 0.1316 | 35.0877 | 7.0175 | 3.5088 | 52.6316 |
| 45 | 1.9406 | 0.1573 | 34.2657 | 7.6923 | 3.4965 | 52.4476 |
| 46 | 2.2561 | 0.1829 | 33.4495 | 8.3624 | 3.4843 | 52.2648 |
| 47 | 2.5694 | 0.2083 | 32.6389 | 9.0278 | 3.4722 | 52.0833 |
| 48 | 2.8806 | 0.2336 | 31.8339 | 9.6886 | 3.4602 | 51.9031 |
| 49 | 0.8186 | 0.0664 | 35.3982 | 7.0796 | 5.3097 | 51.3274 |
| 50 | 1.2225 | 0.0991 | 34.3612 | 7.9295 | 5.2863 | 51.1013 |
| 51 | 1.6228 | 0.1316 | 33.3333 | 8.7719 | 5.2632 | 50.8772 |
| 52 | 1.9406 | 0.1573 | 32.5175 | 9.4406 | 5.2448 | 50.6993 |
| 53 | 2.2561 | 0.1829 | 31.7073 | 10.1045 | 5.2265 | 50.5226 |
| 54 | 2.5694 | 0.2083 | 30.9028 | 10.7639 | 5.2083 | 50.3472 |
| 55 | 2.8806 | 0.2336 | 30.1038 | 11.4187 | 5.1903 | 50.1730 |
| 56 | 3.1897 | 0.2586 | 29.3103 | 12.0690 | 5.1724 | 50.0000 |
| 57 | 3.4966 | 0.2835 | 28.5223 | 12.7148 | 5.1546 | 49.8282 |
| 58 | 3.8014 | 0.3082 | 27.7397 | 13.3562 | 5.1370 | 49.6575 |
| 59 | 4.1041 | 0.3328 | 26.9625 | 13.9932 | 5.1195 | 49.4881 |
| 60 | 4.4048 | 0.3571 | 26.1905 | 14.6259 | 5.1020 | 49.3197 |
| 61 | 0.8186 | 0.0664 | 34.6903 | 7.7876 | 6.0177 | 50.6195 |
| 62 | 1.2225 | 0.0991 | 33.6564 | 8.6344 | 5.9912 | 50.3965 |
| 63 | 1.6228 | 0.1316 | 32.6316 | 9.4737 | 5.9649 | 50.1754 |
| 64 | 1.9406 | 0.1573 | 31.8182 | 10.1399 | 5.9441 | 50.0000 |
| 65 | 2.2561 | 0.1829 | 31.0105 | 10.8014 | 5.9233 | 49.8258 |
| 66 | 2.5694 | 0.2083 | 30.2083 | 11.4583 | 5.9028 | 49.6528 |
| 67 | 2.8806 | 0.2336 | 29.4118 | 12.1107 | 5.8824 | 49.4810 |
| 68 | 3.1897 | 0.2586 | 28.6207 | 12.7586 | 5.8621 | 49.3103 |
| 69 | 3.4966 | 0.2835 | 27.8351 | 13.4021 | 5.8419 | 49.1409 |
| 70 | 3.8014 | 0.3082 | 27.0548 | 14.0411 | 5.8219 | 48.9726 |

TABLE 3-1

| | Designed Composition (mol %) | | | | |
|---|---|---|---|---|---|
| Example | CaO | EuO | Si3N4 | AlN | Al2O3 |
| 1 | 4.7845 | 0.3879 | 75.8621 | 17.2414 | 1.7241 |
| 2 | 4.7517 | 0.3853 | 74.6575 | 17.8082 | 2.3973 |
| 3 | 4.7194 | 0.3827 | 73.4694 | 18.3673 | 3.0612 |
| 4 | 4.6875 | 0.3801 | 72.2973 | 18.9189 | 3.7162 |
| 5 | 4.6250 | 0.3750 | 70.0000 | 20.0000 | 5.0000 |
| 6 | 4.5641 | 0.3701 | 67.7632 | 21.0526 | 6.2500 |
| 7 | 4.5049 | 0.3653 | 65.5844 | 22.0779 | 7.4675 |
| 8 | 4.4758 | 0.3629 | 64.5161 | 22.5806 | 8.0645 |
| 9 | 4.4471 | 0.3606 | 63.4615 | 23.0769 | 8.6538 |
| 10 | 4.3908 | 0.3560 | 61.3924 | 24.0506 | 9.8101 |
| 11 | 6.7137 | 0.5444 | 69.3548 | 22.5806 | 0.8065 |
| 12 | 6.6707 | 0.5409 | 68.2692 | 23.0769 | 1.4423 |
| 13 | 6.6282 | 0.5374 | 67.1975 | 23.5669 | 2.0701 |
| 14 | 6.5862 | 0.5340 | 66.1392 | 24.0506 | 2.6899 |
| 15 | 6.5039 | 0.5273 | 64.0625 | 25.0000 | 3.9063 |
| 16 | 6.4236 | 0.5208 | 62.0370 | 25.9259 | 5.0926 |
| 17 | 6.3453 | 0.5145 | 60.0610 | 26.8293 | 6.2500 |
| 18 | 6.3068 | 0.5114 | 59.0909 | 27.2727 | 6.8182 |
| 19 | 6.2688 | 0.5083 | 58.1325 | 27.7108 | 7.3795 |
| 20 | 6.1942 | 0.5022 | 56.2500 | 28.5714 | 8.4821 |
| 21 | 8.3584 | 0.6777 | 62.6506 | 27.7108 | 0.6024 |
| 22 | 8.3084 | 0.6737 | 61.6766 | 28.1437 | 1.1976 |
| 23 | 8.2589 | 0.6696 | 60.7143 | 28.5714 | 1.7857 |
| 24 | 8.1618 | 0.6618 | 58.8235 | 29.4118 | 2.9412 |
| 25 | 8.0669 | 0.6541 | 56.9767 | 30.2326 | 4.0698 |
| 26 | 7.9741 | 0.6466 | 55.1724 | 31.0345 | 5.1724 |
| 27 | 7.9286 | 0.6429 | 54.2857 | 31.4286 | 5.7143 |
| 28 | 7.8835 | 0.6392 | 53.4091 | 31.8182 | 6.2500 |
| 29 | 7.7949 | 0.6320 | 51.6854 | 32.5843 | 7.3034 |
| 30 | 11.0705 | 0.8976 | 51.5957 | 36.1702 | 0.2660 |
| 31 | 10.9539 | 0.8882 | 50.0000 | 36.8421 | 1.3158 |
| 32 | 10.8398 | 0.8789 | 48.4375 | 37.5000 | 2.3438 |
| 33 | 10.7281 | 0.8698 | 46.9072 | 38.1443 | 3.3505 |

TABLE 3-1-continued

| | Designed Composition (mol %) | | | | |
|---|---|---|---|---|---|
| Example | CaO | EuO | Si3N4 | AlN | Al2O3 |
| 34 | 10.6731 | 0.8654 | 46.1538 | 38.4615 | 3.8462 |
| 35 | 10.6186 | 0.8610 | 45.4082 | 38.7755 | 4.3367 |
| 36 | 10.5114 | 0.8523 | 43.9394 | 39.3939 | 5.3030 |
| 37 | 13.0896 | 1.0613 | 41.5094 | 43.3962 | 0.9434 |
| 38 | 12.9673 | 1.0514 | 40.1869 | 43.9252 | 1.8692 |

TABLE 3-2

| | Designed Composition (mol %) | | | | |
|---|---|---|---|---|---|
| Example | CaO | EuO | Si3N4 | AlN | Al2O3 |
| 39 | 12.9070 | 1.0465 | 39.5349 | 44.1860 | 2.3256 |
| 40 | 12.8472 | 1.0417 | 38.8889 | 44.4444 | 2.7778 |
| 41 | 12.7294 | 1.0321 | 37.6147 | 44.9541 | 3.6697 |
| 42 | 4.6250 | 0.3750 | 70.0000 | 20.0000 | 5.0000 |
| 43 | 6.5039 | 0.5273 | 64.0625 | 25.0000 | 3.9063 |
| 44 | 8.1618 | 0.6618 | 58.8235 | 29.4118 | 2.9412 |
| 45 | 9.3539 | 0.7584 | 55.0562 | 32.5843 | 2.2472 |
| 46 | 10.4435 | 0.8468 | 51.6129 | 35.4839 | 1.6129 |
| 47 | 11.4433 | 0.9278 | 48.4536 | 38.1443 | 1.0309 |
| 48 | 12.3639 | 1.0025 | 45.5446 | 40.5941 | 0.4950 |
| 49 | 4.4758 | 0.3629 | 64.5161 | 22.5806 | 8.0645 |
| 50 | 6.3068 | 0.5114 | 59.0909 | 27.2727 | 6.8182 |
| 51 | 7.9286 | 0.6429 | 54.2857 | 31.4286 | 5.7143 |
| 52 | 9.0984 | 0.7377 | 50.8197 | 34.4262 | 4.9180 |
| 53 | 10.1702 | 0.8246 | 47.6440 | 37.1728 | 4.1885 |
| 54 | 11.1558 | 0.9045 | 44.7236 | 39.6985 | 3.5176 |
| 55 | 12.0652 | 0.9783 | 42.0290 | 42.0290 | 2.8986 |
| 56 | 12.9070 | 1.0465 | 39.5349 | 44.1860 | 2.3256 |
| 57 | 13.6883 | 1.1099 | 37.2197 | 46.1883 | 1.7937 |
| 58 | 14.4156 | 1.1688 | 35.0649 | 48.0519 | 1.2987 |
| 59 | 15.0941 | 1.2238 | 33.0544 | 49.7908 | 0.8368 |
| 60 | 15.7287 | 1.2753 | 31.1741 | 51.4170 | 0.4049 |
| 61 | 4.4188 | 0.3583 | 62.4204 | 23.5669 | 9.2357 |
| 62 | 6.2313 | 0.5052 | 57.1856 | 28.1437 | 7.9341 |
| 63 | 7.8390 | 0.6356 | 52.5424 | 32.2034 | 6.7797 |
| 64 | 9.0000 | 0.7297 | 49.1892 | 35.1351 | 5.9459 |
| 65 | 10.0648 | 0.8161 | 46.1140 | 37.8238 | 5.1813 |
| 66 | 11.0448 | 0.8955 | 43.2836 | 40.2985 | 4.4776 |
| 67 | 11.9498 | 0.9689 | 40.6699 | 42.5837 | 3.8278 |
| 68 | 12.7880 | 1.0369 | 38.2488 | 44.7005 | 3.2258 |
| 69 | 13.5667 | 1.1000 | 36.0000 | 46.6667 | 2.6667 |
| 70 | 14.2918 | 1.1588 | 33.9056 | 48.4979 | 2.1459 |

TABLE 4-1

| | Mixed Composition (wt %) | | | | |
|---|---|---|---|---|---|
| Example | CaCO3 | Eu2O3 | Si3N4 | AlN | Al2O3 |
| 1 | 3.9700 | 0.5700 | 88.1550 | 5.8540 | 1.4600 |
| 2 | 3.9700 | 0.5600 | 87.3410 | 6.0880 | 2.0400 |
| 3 | 3.9700 | 0.5600 | 86.5270 | 6.3210 | 2.6200 |
| 4 | 3.9700 | 0.5600 | 85.7130 | 6.5540 | 3.2000 |
| 5 | 3.9600 | 0.5600 | 84.0850 | 7.0210 | 4.3700 |
| 6 | 3.9600 | 0.5600 | 82.4580 | 7.4860 | 5.5300 |
| 7 | 3.9600 | 0.5600 | 80.8300 | 7.9520 | 6.6900 |
| 8 | 3.9600 | 0.5600 | 80.0190 | 8.1840 | 7.2700 |
| 9 | 3.9600 | 0.5600 | 79.2070 | 8.4170 | 7.8500 |
| 10 | 3.9600 | 0.5600 | 77.5840 | 8.8810 | 9.0100 |
| 11 | 5.8400 | 0.8300 | 84.5660 | 8.0460 | 0.7100 |
| 12 | 5.8400 | 0.8300 | 83.7660 | 8.2750 | 1.2900 |
| 13 | 5.8400 | 0.8300 | 82.9680 | 8.5030 | 1.8600 |
| 14 | 5.8400 | 0.8300 | 82.1680 | 8.7310 | 2.4300 |
| 15 | 5.8400 | 0.8300 | 80.5710 | 9.1880 | 3.5700 |
| 16 | 5.8400 | 0.8300 | 78.9760 | 9.6440 | 4.7100 |
| 17 | 5.8300 | 0.8300 | 77.3800 | 10.1010 | 5.8500 |
| 18 | 5.8300 | 0.8300 | 76.5840 | 10.3290 | 6.4200 |
| 19 | 5.8300 | 0.8300 | 75.7860 | 10.5570 | 6.9900 |

TABLE 4-1-continued

| Example | Mixed Composition (wt %) | | | | |
|---|---|---|---|---|---|
| | CaCO3 | Eu2O3 | Si3N4 | AlN | Al2O3 |
| 20 | 5.8300 | 0.8300 | 74.1940 | 11.0130 | 8.1300 |
| 21 | 7.6500 | 1.0900 | 80.3210 | 10.3810 | 0.5600 |
| 22 | 7.6500 | 1.0900 | 79.5370 | 10.6050 | 1.1200 |
| 23 | 7.6400 | 1.0900 | 78.7530 | 10.8300 | 1.6800 |
| 24 | 7.6400 | 1.0900 | 77.1860 | 11.2780 | 2.8000 |
| 25 | 7.6400 | 1.0900 | 75.6210 | 11.7250 | 3.9300 |
| 26 | 7.6400 | 1.0900 | 74.0550 | 12.1730 | 5.0500 |
| 27 | 7.6400 | 1.0900 | 73.2730 | 12.3960 | 5.6100 |
| 28 | 7.6400 | 1.0900 | 72.4900 | 12.6200 | 6.1700 |
| 29 | 7.6300 | 1.0900 | 70.9280 | 13.0660 | 7.2900 |
| 30 | 11.0700 | 1.5800 | 72.2790 | 14.8070 | 0.2700 |
| 31 | 11.0600 | 1.5800 | 70.7690 | 15.2380 | 1.3500 |
| 32 | 11.0600 | 1.5800 | 69.2600 | 15.6690 | 2.4400 |
| 33 | 11.0600 | 1.5800 | 67.7510 | 16.1000 | 3.5200 |
| 34 | 11.0500 | 1.5800 | 66.9970 | 16.3150 | 4.0600 |
| 35 | 11.0500 | 1.5800 | 66.2420 | 16.5290 | 4.6000 |
| 36 | 11.0500 | 1.5800 | 64.7350 | 16.9590 | 5.6800 |
| 37 | 14.2500 | 2.0300 | 63.3270 | 19.3460 | 1.0500 |
| 38 | 14.2400 | 2.0300 | 61.8710 | 19.7620 | 2.0900 |

TABLE 4-2

| Example | Mixed Composition (wt %) | | | | |
|---|---|---|---|---|---|
| | CaCO3 | Eu2O3 | Si3N4 | AlN | Al2O3 |
| 39 | 14.2400 | 2.0300 | 61.1430 | 19.9590 | 2.6100 |
| 40 | 14.2400 | 2.0300 | 60.4150 | 20.1760 | 3.1400 |
| 41 | 14.2400 | 2.0300 | 58.9610 | 20.5910 | 4.1800 |
| 42 | 3.9600 | 0.5600 | 84.0850 | 7.0210 | 4.3700 |
| 43 | 5.8400 | 0.8300 | 80.5710 | 9.1880 | 3.5700 |
| 44 | 7.6400 | 1.0900 | 77.1860 | 11.2780 | 2.8000 |
| 45 | 9.0400 | 1.2900 | 74.5640 | 12.8950 | 2.2100 |
| 46 | 10.4000 | 1.4800 | 72.0170 | 14.4680 | 1.6400 |
| 47 | 11.7200 | 1.6700 | 69.5390 | 15.9970 | 1.0800 |
| 48 | 13.0000 | 1.8500 | 67.1290 | 17.4840 | 0.5300 |
| 49 | 3.9600 | 0.5600 | 80.0190 | 8.1840 | 7.2700 |
| 50 | 5.8300 | 0.8300 | 76.5840 | 10.3290 | 6.4200 |
| 51 | 7.6400 | 1.0900 | 73.2730 | 12.3960 | 5.6100 |
| 52 | 9.0300 | 1.2900 | 70.7080 | 13.9970 | 4.9700 |
| 53 | 10.3900 | 1.4800 | 68.2170 | 15.5530 | 4.3600 |
| 54 | 11.7100 | 1.6700 | 65.7930 | 17.0650 | 3.7600 |
| 55 | 12.9900 | 1.8500 | 63.4360 | 18.5370 | 3.1800 |
| 56 | 14.2400 | 2.0300 | 61.1430 | 19.9690 | 2.6100 |
| 57 | 15.4600 | 2.2000 | 58.9100 | 21.3620 | 2.0600 |
| 58 | 16.6400 | 2.3700 | 56.7370 | 22.7200 | 1.5300 |
| 59 | 17.8000 | 2.5400 | 54.6190 | 24.0420 | 1.0100 |
| 60 | 18.9200 | 2.7000 | 52.5550 | 25.3300 | 0.5000 |
| 61 | 3.9600 | 0.5600 | 78.3950 | 8.6490 | 8.4300 |
| 62 | 5.8300 | 0.8300 | 74.9900 | 10.7850 | 7.5600 |
| 63 | 7.6300 | 1.0900 | 71.7090 | 12.8430 | 6.7300 |
| 64 | 9.0300 | 1.2900 | 69.1680 | 14.4370 | 6.0800 |
| 65 | 10.3900 | 1.4800 | 66.6980 | 15.9860 | 5.4500 |
| 66 | 11.7100 | 1.6700 | 64.2960 | 17.4930 | 4.8300 |
| 67 | 12.9900 | 1.8500 | 61.9610 | 18.9580 | 4.2400 |
| 68 | 14.2400 | 2.0300 | 59.6870 | 20.3840 | 3.6600 |
| 69 | 15.4600 | 2.2000 | 57.4750 | 21.7710 | 3.0900 |
| 70 | 16.6400 | 2.3700 | 55.3200 | 23.1230 | 2.5400 |

TABLE 5-1

| Example | Parameter | | Excitation Wavelength (nm) | Emission Wavelength (nm) | Emission Intensity (arbitrary unit) |
|---|---|---|---|---|---|
| | m | n | | | |
| 1 | 0.5 | 0.5 | 411 | 571 | 2469 |
| 2 | 0.5 | 0.6 | 410 | 572 | 2816 |
| 3 | 0.5 | 0.7 | 409 | 572 | 2824 |
| 4 | 0.5 | 0.8 | 412 | 569 | 3164 |
| 5 | 0.5 | 1 | 412 | 569 | 3329 |
| 6 | 0.5 | 1.2 | 410 | 568 | 3528 |
| 7 | 0.5 | 1.4 | 412 | 568 | 3673 |
| 8 | 0.5 | 1.5 | 412 | 568 | 4053 |
| 9 | 0.5 | 1.6 | 413 | 567 | 4133 |
| 10 | 0.5 | 1.8 | 418 | 568 | 4566 |
| 11 | 0.75 | 0.5 | 409 | 574 | 3522 |
| 12 | 0.75 | 0.6 | 412 | 573 | 3653 |
| 13 | 0.75 | 0.7 | 409 | 573 | 3569 |
| 14 | 0.75 | 0.8 | 410 | 573 | 3777 |
| 15 | 0.75 | 1 | 417 | 568 | 4661 |
| 16 | 0.75 | 1.2 | 412 | 568 | 4952 |
| 17 | 0.75 | 1.4 | 412 | 568 | 4811 |
| 18 | 0.75 | 1.5 | 419 | 568 | 5916 |
| 19 | 0.75 | 1.6 | 419 | 568 | 5831 |
| 20 | 0.75 | 1.8 | 418 | 568 | 5421 |
| 21 | 1 | 0.6 | 410 | 575 | 4622 |
| 22 | 1 | 0.7 | 412 | 573 | 4868 |
| 23 | 1 | 0.8 | 412 | 574 | 4708 |
| 24 | 1 | 1 | 412 | 572 | 5547 |
| 25 | 1 | 1.2 | 412 | 573 | 5819 |
| 26 | 1 | 1.4 | 412 | 573 | 6379 |
| 27 | 1 | 1.5 | 418 | 572 | 6259 |
| 28 | 1 | 1.6 | 420 | 573 | 6567 |
| 29 | 1 | 1.8 | 419 | 569 | 6211 |
| 30 | 1.5 | 0.8 | 412 | 580 | 6286 |
| 31 | 1.5 | 1 | 418 | 579 | 6530 |
| 32 | 1.5 | 1.2 | 418 | 578 | 6766 |
| 33 | 1.5 | 1.4 | 438 | 578 | 7140 |
| 34 | 1.5 | 1.5 | 438 | 577 | 6529 |
| 35 | 1.5 | 1.6 | 439 | 575 | 7549 |
| 36 | 1.5 | 1.8 | 444 | 575 | 4572 |
| 37 | 2 | 1.2 | 437 | 583 | 6537 |
| 38 | 2 | 1.4 | 442 | 581 | 6578 |

TABLE 5-2

| Example | Parameter | | Excitation Wavelength (nm) | Emission Wavelength (nm) | Emission Intensity (arbitrary unit) |
|---|---|---|---|---|---|
| | m | n | | | |
| 39 | 2 | 1.5 | 442 | 581 | 6256 |
| 40 | 2 | 1.6 | 449 | 578 | 6439 |
| 41 | 2 | 1.8 | 449 | 578 | 6381 |
| 42 | 0.5 | 1 | 401 | 568 | 2297 |
| 43 | 0.75 | 1 | 412 | 571 | 4660 |
| 44 | 1 | 1 | 412 | 571 | 5193 |
| 45 | 1.2 | 1 | 410 | 574 | 5601 |
| 46 | 1.4 | 1 | 412 | 577 | 6506 |
| 47 | 1.6 | 1 | 412 | 580 | 6300 |
| 48 | 1.8 | 1 | 413 | 582 | 5450 |
| 49 | 0.5 | 1.5 | 412 | 569 | 3228 |
| 50 | 0.75 | 1.5 | 412 | 569 | 5121 |
| 51 | 1 | 1.5 | 412 | 571 | 5770 |
| 52 | 1.2 | 1.5 | 419 | 574 | 6020 |
| 53 | 1.4 | 1.5 | 438 | 574 | 5849 |
| 54 | 1.6 | 1.5 | 437 | 577 | 6126 |
| 55 | 1.8 | 1.5 | 437 | 579 | 6383 |
| 56 | 2 | 1.5 | 449 | 582 | 6084 |
| 57 | 2.2 | 1.5 | 449 | 583 | 6370 |
| 58 | 2.4 | 1.5 | 449 | 583 | 6330 |
| 59 | 2.6 | 1.5 | 449 | 583 | 6428 |
| 60 | 2.8 | 1.5 | 449 | 587 | 6213 |
| 61 | 0.5 | 1.7 | 419 | 568 | 4130 |
| 62 | 0.75 | 1.7 | 418 | 568 | 6664 |
| 63 | 1 | 1.7 | 436 | 568 | 6911 |
| 64 | 1.2 | 1.7 | 438 | 570 | 7472 |
| 65 | 1.4 | 1.7 | 438 | 573 | 6791 |
| 66 | 1.6 | 1.7 | 448 | 575 | 7817 |
| 67 | 1.8 | 1.7 | 449 | 577 | 7385 |

TABLE 5-2-continued

| Example | Parameter m | n | Excitation Wavelength (nm) | Emission Wavelength (nm) | Emission Intensity (arbitrary unit) |
|---|---|---|---|---|---|
| 68 | 2 | 1.7 | 449 | 580 | 7151 |
| 69 | 2.2 | 1.7 | 449 | 580 | 6817 |
| 70 | 2.4 | 1.7 | 449 | 581 | 7110 |

Next, a lighting apparatus using the phosphor which comprises the nitride of the present invention is explained.

Example 72

A so-called bullet-type white light-emitting diode lamp (1) shown in FIG. 8 was produced. There are two lead wires (2, 3), one of which (2) has a recess, in which a blue light-emitting diode device (4) is placed. The lower electrode of the blue light-emitting diode device (4) and the bottom surface of the recess are electrically connected with conductive paste, and the upper electrode and the other lead wire (3) are electrically connected to a gold filament (5). The phosphor used in the present example is a phosphor produced as Example 71. The phosphor (7) is dispersed in resin and mounted in the vicinity of the light emitting diode device (4). The first resin (6) in which this phosphor is dispersed is transparent, and covers the entire blue light-emitting diode device (4). The tip portion of the lead wire including the recess, the blue light-emitting diode device, and the first resin in which the phosphor is dispersed are sealed with transparent second resin (8). The entire part of the transparent second resin (8) is roughly cylindrical, the tip portion of which is formed as a lens-like curved surface. Thus, the diode lamp is commonly called a bullet-type diode lamp.

In the present example, the phosphor powder of Example 71 was mixed into epoxy resin in a concentration of 37 wt %, and a proper amount of the resultant mixture was dropped using a dispenser to form the first resin (6) in which the phosphor (7) was dispersed. The resultant color coordinates were x=0.34 and y=0.34, which represent a white color.

Example 73

A tip-type white light-emitting diode lamp (21) for mounting on a substrate was produced. The structure is shown in FIG. 9. Two lead wires (22, 23) are fixed to a white alumina ceramic substrate (29) having high visible light reflectivity. One end of each of these wires is located nearly at the central part of the substrate, and the other end of each extends to the outside to serve as an electrode to be soldered when the lamp is mounted on an electric substrate. A blue light-emitting diode device (24) is placed and fixed to the one end of one (22) of the lead wires so that the diode is located at the central part of the substrate. The lower electrode of the blue light-emitting diode device (24) and the lead wire below are electrically connected with conductive paste, and the upper electrode and the other lead wire (23) are electrically connected to a gold filament (25).

A mixture of first resin (26) and a phosphor (27) is mounted in the vicinity of the light emitting diode device. The first resin in which this phosphor is dispersed is transparent, and covers the entire blue light-emitting diode device (24). Moreover, on the ceramic substrate, a wall surface member (30) having a hole opened at the central part is fixed. The central part of the wall surface member (30) is formed into a hole in which the first resin (26) which contains the blue light-emitting diode device (24) and the phosphor (27) dispersed therein is to be accommodated, and the portion which faces the central part forms a slope. This slope is a reflective surface for taking out a light forward, and the shape of the curved surface of that slope is determined in consideration of the direction of light reflection. Moreover, at least the surface which constitutes the reflective surface forms a surface having high visible light reflectivity with white or metallic luster. In the present example, the wall surface member is constituted of white silicone resin (30). The hole at the central part of the wall surface member forms a recess as the final shape of the tip-type light emitting diode lamp, and is filled up with second transparent resin (28) to seal all of the blue light-emitting diode device (24) and the first resin (26) in which the phosphor (27) is dispersed. In the present example, the same epoxy resin is used for both the first resin (26) and second resin (28). The ratio of phosphor addition, the attained chromaticity, and the like are approximately identical to those in the foregoing example.

Next, an example of design of an image display device using the phosphor of the present invention is described.

Example 74

FIG. 10 is a schematic diagram of a principle of a plasma display panel as an image display device. A red color phosphor ($CaAlSiN_3:Eu^{2+}$) (31), a green color phosphor (32) of Example 71 of the present invention, and a blue color phosphor ($BaMgAl_{10}O_{17}:Eu$) (33) are applied on the internal surface of respective cells (34, 35, 36). The cells (34, 35, 36) are located on a glass substrate (44) to which a dielectric layer (41) and electrodes (37, 38, 39) are provided. If electric power is supplied to the electrodes (37, 38, 39, 40), a vacuum ultraviolet ray is generated by Xe discharge in the cells. The phosphors are excited by the vacuum ultraviolet ray to emit red, yellow-green, and blue visible lights. The emitted lights are observed from the outside through a protective layer (43), a dielectric layer (42), and a glass substrate (45) to function as an image display.

INDUSTRIAL APPLICABILITY

The nitride phosphor of the present invention shows a light emission at a wavelength shorter than the conventional sialon or oxynitride phosphor does. And it is superior as a yellow-green color phosphor and shows only a small decrease of phosphor brightness when exposed to the excitation source. Thus, the nitride phosphor of the present invention can be suitably used for VFD, FED, PDP, CRT, white color LED, and the like. It is expected that the phosphor of the present invention will be much applied to various kinds of display devices in the material design so as to contribute to the development of the industry.

What is claimed is:

1. A phosphor comprising: α-type sialon crystal as a main component, wherein the α-type sialon crystal comprises:
    at least an A element, which is Eu;
    an M element, which is Ca;
    Si;
    Al;
    oxygen; and
    nitrogen, wherein the α-type sialon crystal is expressed by a general formula:

$$(M_xA_y)(Si_{12-(m+n)}Al_{m+n})(O_nN_{16-n}) \quad (1), \text{ and}$$

$$m=\delta_M \times x + \delta_A \times y \quad (2),$$

wherein the α-type sialon crystal is expressed by a composition formula having parameters x, y, m, and n, which are in a range expressed by:

$$0.2 \leq x \leq 2.4 \quad (3),$$

$$0.001 \leq y \leq 0.4 \quad (4),$$

$$0.5 \times m < n \leq 4 \quad (5),$$

$$0.6 \leq m \leq 1.4 \quad (7), \text{ and}$$

$$0.8 \leq n \leq 2 \quad (8);$$

wherein x is an amount of solid solution of M in a sialon unit cell, y is an amount of solid solution of A in the sialon unit cell, and n is a content amount of oxygen in the sialon unit cell; and wherein the phosphor emits fluorescence having a peak in a wavelength range from 560 nm to 575 nm upon irradiation of an excitation source.

2. The phosphor according to claim 1, wherein the excitation source is a violet light or a visible light having a wavelength which is 100 nm or more and 500 nm or shorter.

3. The phosphor according to claim 1, wherein an emission color upon irradiation of the excitation source is represented by (x, y) values in the CIE Chromaticity coordinate and satisfies conditions:

$$0.3 \leq x \leq 0.5 \quad (9)$$

$$0.46 \leq y \leq 0.6 \quad (10).$$

4. The phosphor according to claim 1, comprises a primary particle of the α-type sialon crystal which is characterized by a diameter of 0.5 μm or more along a minor axis and an aspect ratio of 3 or more.

5. The phosphor according to claim 1, comprises: an amorphous phase or another crystalline phase than the α-type sialon crystal, wherein a content amount of the α-type sialon crystal is 10 mass % or more.

6. The phosphor according to claim 5, wherein the content amount of the α-type sialon crystal is 50 mass % or more.

7. The phosphor according to claim 5, wherein the amorphous phase or the other crystalline phase is inorganic substance having electronic conductivity.

8. A lighting apparatus comprising: an excitation source and a phosphor, wherein the phosphor comprises at least the phosphor comprising: α-type sialon crystal as a main component,
wherein the α-type sialon crystal comprises:
at least an A element, which is Eu;
an M element, which is Ca;
Si;
Al;
oxygen; and
nitrogen,
wherein the α-type sialon crystal is expressed by a general formula:

$$(M_xA_y)(Si_{12-(m+n)}Al_{m+n})(O_nN_{16-n}) \quad (1), \text{ and}$$

$$m=\delta_M \times x + \delta_A \times y \quad (2),$$

wherein the α-type sialon crystal is expressed by a composition formula having parameters x, y, m, and n, which are in a range expressed by:

$$0.2 \leq x \leq 2.4 \quad (3),$$

$$0.001 \leq y \leq 0.4 \quad (4),$$

$$0.5 \times m < n \leq 4 \quad (5),$$

$$0.6 \leq m \leq 1.4 \quad (7), \text{ and}$$

$$0.8 \leq n \leq 2 \quad (8);$$

wherein x is an amount of solid solution of M in a sialon unit cell, y is an amount of solid solution of A in the sialon unit cell, and n is a content amount of oxygen in the sialon unit cell; and wherein the phosphor emits fluorescence having a peak in a wavelength range from 560 nm to 575 nm upon irradiation of an excitation source.

9. The lighting apparatus according to claim 8, wherein the excitation source comprises: an inorganic EL device; an organic EL device; a laser diode (LD); or a light-emitting diode (LED) to emit a light of wavelength from 330 to 500 nm.

10. The lighting apparatus according to claim 8,
wherein the excitation source is a LED or a LD which emits a light of wavelength from 330 to 420 nm,
wherein the phosphor further comprises:
a blue color phosphor having an emission peak in wavelength range of 450 nm to 500 nm by an excitation light of 330 nm to 420 nm; and
a red color phosphor having an emission peak in wavelength range of 600 nm to 700 nm by an excitation light of 330 nm to 420 nm, and
wherein the lighting apparatus emits a white light by mixing a blue light; a color of a light emitted by the phosphor other than the blue color and red color phosphors; and a red color.

11. The lighting apparatus according to claim 8, wherein the excitation source is a LED or a LD which emits a light of wavelength from 430 to 480 nm; and wherein the lighting apparatus emits a white light by mixing a blue light of the excitation source and a light emitted by the phosphor.

12. The lighting apparatus according to claim 8,
wherein the excitation source is a LED or a LD which emits a light of wavelength from 430 to 480 nm;
wherein the phosphor further comprises:
an orange or a red color phosphor (hereinafter, referred to as "second phosphor") having an emission peak in wavelength range of 580 nm to 700 nm by an excitation light of 430 nm to 480 nm, and
wherein the lighting apparatus emits a white light by mixing a light emitted by the phosphor and an orange or red light of the second phosphor.

13. The lighting apparatus according to claim 12, wherein the second phosphor is an Eu-activated CaAlSiN$_3$.

14. The lighting apparatus according to claim 12, wherein the second phosphor is an Eu-activated Ca-α-sialon.

15. An image display device comprising:
at least the phosphor recited in claim 1; and an excitation source of the phosphor.

16. The image display device according to claim 15, wherein the excitation source is an electron beam, an electrical field, a vacuum ultraviolet ray, or an ultraviolet ray.

17. The image display device according to claim 15, wherein the image display device is a fluorescent display (VFD), a field emission display (FED), a plasma display panel (PDP), or a cathode-ray tube (CRT).

18. A method of manufacturing a phosphor, wherein the phosphor comprises: α-type sialon crystal as a main component, wherein the α-type sialon crystal comprises: at least an A element, which is Eu; an M element, which is Ca; Si; Al; oxygen; and nitrogen, wherein the α-sialon crystal is expressed by a general formula:

$$(M_x, A_y)(Si_{12-(m+n)}Al_{m+n})(O_n N_{16-n}) \quad (1); \text{ and}$$

$$m = \delta_M \times x + \delta_A \times y \quad (2),$$

wherein the α-type sialon crystal is expressed by a composition formula having parameters x, y, and n, which are in a range expressed by:

$$0.2 \leq x \leq 2.4 \quad (3); \text{ and}$$

$$0.001 \leq y \leq 0.4 \quad (4),$$

wherein a relation between m and n is expressed by:

$$0.5 \times m < n \leq 4 \quad (5), \text{ and}$$

wherein x is an amount of solid solution of Ca in a sialon unit cell, y is an amount of solid solution of Eu in the sialon unit cell, and n is a content amount of oxygen in the sialon unit cell; and wherein the phosphor emits fluorescence having a peak in a wavelength range from 530 nm to 585 nm.

19. The method according to claim 18, wherein the parameters m and n are in a range expressed by:

$$0.6 \times m \leq n \leq 2 \quad (6).$$

20. The method of manufacturing the phosphor according to claim 18, comprising: firing in a nitrogen atmosphere in a temperature range which is 1500 degree Celsius or higher and 2200 degree Celsius or lower a raw material mixture comprising: at least oxide of Ca; oxide of Eu; silicon nitride; aluminum nitride; and silicon oxide or aluminum oxide.

* * * * *